(12) United States Patent
Davis et al.

(10) Patent No.: US 10,068,046 B2
(45) Date of Patent: Sep. 4, 2018

(54) SYSTEMS AND METHODS FOR TRACKING CHANGES TO AND IDENTIFYING LAYERS OF INTEGRATED CIRCUIT DEVICES

(71) Applicant: Silicon Laboratories Inc., Austin, TX (US)

(72) Inventors: Jessica P. Davis, Austin, TX (US); James L Deeringer, Jr., Pflugerville, TX (US); Sridhar Hariharan, Austin, TX (US); Harry Levanti, Buda, TX (US); David M. Szmyd, Austin, TX (US); Sarah P. Walton, Austin, TX (US); Steven G. Young, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 198 days.

(21) Appl. No.: 14/976,707

(22) Filed: Dec. 21, 2015

(65) Prior Publication Data

US 2017/0177775 A1 Jun. 22, 2017

(51) Int. Cl.
*G06F 17/50* (2006.01)

(52) U.S. Cl.
CPC ................ *G06F 17/5068* (2013.01)

(58) Field of Classification Search
CPC .................................... G06F 17/5068
USPC .......................................... 716/55
See application file for complete search history.

(56) References Cited

U.S. PATENT DOCUMENTS

| | | | |
|---|---|---|---|
| 5,644,144 A * | 7/1997 | Ray | G03F 7/70541 |
| | | | 257/48 |
| 5,787,012 A | 7/1998 | Levitt | |
| 6,933,547 B2 | 8/2005 | Catalasan et al. | |
| 7,589,362 B1 * | 9/2009 | Argyres | H01L 23/585 |
| | | | 257/208 |
| 7,943,400 B2 | 5/2011 | Nataraj | |
| 8,627,264 B1 * | 1/2014 | Venkitachalam | G03F 1/00 |
| | | | 716/111 |
| 2002/0084331 A1 | 7/2002 | Reinschmidt et al. | |
| 2004/0251470 A1 * | 12/2004 | Catalasan | H01L 23/544 |
| | | | 257/100 |

(Continued)

OTHER PUBLICATIONS

Fab, Mixed Signal Foundry Experts, Mask Tooling Engineer-Technology, Printed From Internet Dec. 6, 2015, 2 pgs.

*Primary Examiner* — Suchin Parihar
(74) *Attorney, Agent, or Firm* — Egan Peterman Enders Huston

(57) ABSTRACT

Systems and methods are provided that may be implemented to identify and track layer changes of an integrated circuit (IC) device, e.g., during any one of circuit design, pattern generation, device fabrication and/or chip failure analysis processes. Multiple revisions and variants of different IC layers may be identified and tracked using a tracking system and standardized labeling scheme that employs a combination of identifier characters and identifier structures that may be further implemented using revision layer identification parameterized cells (layerID PCells and BooleanID PCells) that include such identifier characters and/or structures The disclosed tracking systems may be further implemented in an automated manner and/or in a manner that allows programming of various parts/aspects and layerID PCells and BooleanID PCells of the tracking system.

26 Claims, 15 Drawing Sheets

(56) References Cited

U.S. PATENT DOCUMENTS

| | | | | |
|---|---|---|---|---|
| 2004/0251472 A1* | 12/2004 | Catalasan | G11C 17/10 | |
| | | | 257/181 | |
| 2004/0251501 A1* | 12/2004 | Catalasan | H01L 23/544 | |
| | | | 257/355 | |
| 2004/0253778 A1* | 12/2004 | Catalasan | H01L 23/544 | |
| | | | 438/200 | |
| 2005/0005268 A1 | 1/2005 | Zilavy et al. | | |
| 2006/0110025 A1 | 5/2006 | Ho et al. | | |
| 2009/0075178 A1* | 3/2009 | Jahnke | G03F 1/44 | |
| | | | 430/5 | |
| 2009/0140435 A1* | 6/2009 | Lynch | H01L 23/544 | |
| | | | 257/774 | |
| 2010/0270684 A1* | 10/2010 | Check | H01L 23/544 | |
| | | | 257/774 | |
| 2013/0031519 A1* | 1/2013 | Bashaboina | G03F 7/70433 | |
| | | | 716/52 | |

* cited by examiner

| MAJOR REV (202) (ALL LAYERS) | MINOR REV (204) (METAL OR VIA LAYERS) | | VARIANTS (206) (FOR TEST OR DESIGN OPTIONS) | | SUPPLEMENTS (208) | | MINI CHARACTER LAYER NUMBER ID (210) | MINI CHARACTER LAYER TYPE ID (210) | |
|---|---|---|---|---|---|---|---|---|---|
| ALPHABETIC REVISION CHARACTER IDENTIFIER | REVISION NUMBER | COMB STRUCTURE IDENTIFIER | REVISION NUMBER | COMB STRUCTURE IDENTIFIER | REVISION NUMBER | COMB STRUCTURE IDENTIFIER | NUMERIC REVISION CHARACTER IDENTIFIER | LAYER ID | POLYGON OR POLYGON PATTERN IDENTIFIER |
| A | 0 | ⊓⊓⊓ | 0 | ⊓⊏⊏ | 0 | ⊓⊓⊓ | 1 | METAL | ▨ |
| B | 1 | ⊓⊓⊓ | 1 | ⊓⊏⊏ | 1 | ⊓⊓⊓ | 2 | VIA | ▦ |
| C | 2 | ⊓⊓⊓ | 2 | ⊓⊏⊏ | 2 | ⊓⊓⊓ | 3 | | |
| D | 3 | ⊓⊓⊓ | 3 | ⊓⊏⊏ | 3 | ⊓⊓⊓ | 4 | | |
| ... | ... | ... | ... | ... | ... | ... | ... | ... | ... |
| N | N | ⊓⊓⊓ | N | ⊓⊏⊏ | N | ⊓⊓⊓ | N | | |

SYSTEMS AND METHODS FOR TRACKING CHANGES TO AND IDENTIFYING LAYERS OF INTEGRATED CIRCUIT DEVICES

FIELD OF THE INVENTION

This invention relates generally to integrated circuit fabrication and, more particularly, to circuit layer identification information for integrated circuitry.

BACKGROUND

Integrated circuits are typically fabricated on a semiconductor wafer using photolithography to define multiple vertically stacked or overlapping circuit layers. Each of the circuit layers typically include combinations and patterns of conductive metals, semiconductor materials, and dielectric materials that together form circuitry and circuit devices. Conductive vias or contacts are formed to extend vertically between the layers to interconnect different layers with each other. Photoreticles or photomasks are used to transfer circuit patterns for each circuit layer onto a semiconductor material by selectively exposing the semiconductor material to laser radiation according to the reticle pattern during the photolithography process. A photoreticle typically includes a circuit pattern that is generated and written into a chrome layer on a fused silica or quartz substrate from data files that are created and edited using electronic design automation (EDA) software design tools. Photoreticles are typically loaded into a stepper or scanner for exposing the semiconductor material to radiation during the photolithography process. During the circuit design and testing process, circuit patterns may be revised to correct or update a circuit design, and/or may be modified to create different functionality for a given circuit layer. It is known to label a semiconductor circuit die with a corresponding chip part number to serve as a visual identifier on the finished semiconductor product.

SUMMARY

Disclosed herein are systems and methods that may be implemented using layer identification information to identify and track individual layer changes (e.g., revisions, variants, supplements, etc.) of an integrated circuit (IC) design and corresponding integrated circuit (IC) device, e.g., during any one of circuit design, pattern generation, device fabrication and/or failure analysis. Examples of such layer revisions include, but are not limited to, revisions caused by changes to number, configuration and/or routing of conductive signal and/or power traces; changes to number, configuration and/or location of circuit devices or components thereof (e.g., resistors, capacitors, transistors, etc.); changes to location, configuration and/or number of other circuit features such as interconnects, contacts, vias, pads, diffusion regions, etc. In this regard, layer identification information may be implemented to identify a current revision of a given layer of an IC design or IC device in a manner that is independent of the current revision of other layers of the same IC design or IC device.

In one embodiment, multiple revisions and variants of different integrated circuit (IC) layers may be identified and tracked using a tracking system and standardized labeling scheme that employs a combination of identifier characters (e.g., that may include letters and/or numerals) and identifier structures such as comb structures with removable tabs. Such a standardized labeling scheme may be further implemented using layer revision identification parameterized data cells (layerID PCells and BooleanID PCells) that include such identifier characters and/or structures and that are generated by electronic design automation (EDA) software, and that may be used to create counterpart physical PCells in the form of labels that include layer identification information on a physical die that is manufactured (e.g., on a silicon substrate from insulator, dielectric, semiconductor, metal, etc. materials), such as during a complementary metal-oxide semiconductor (CMOS) fabrication process. Further, the disclosed tracking systems may be implemented in an automated manner and/or in a manner that allows programming of various parts/aspects and layerID PCells and BooleanID PCells of the tracking system. A "die" refers to a piece of semiconducting material on which a functional circuit/s including multiple stacked layers (e.g., metal layers, via layers, base layers, etc.) is fabricated, e.g., such as integrated circuits that are produced in a batch on a single wafer of electronic-grade silicon (EGS) or other semiconductor (such as GaAs) through processes including photolithography. Such a wafer may be cut or diced into individual pieces that are each called a "die" and which each contain one version or copy of circuitry.

In one embodiment, the disclosed systems and methods may be advantageously implemented to remove ambiguity in the way that minor revisions (i.e., revisions that typically include only the metal and via layers without changes to the base layers) to integrated circuitry layers are tracked, as well as providing a convenient way of tracking IC layer variants (i.e., changes that occur within a single major and/or minor revision of a circuit design). In one embodiment, a clear and concise way may be implemented to track only the IC layers that need to change and to identify which IC layers have not changed. This may be employed to easily track changes to circuit layer patterns made in a computer database after initial tapeout but prior to actual photomask or reticle making. By providing a standardized labeling system, inconsistencies may be eliminated between the identifier information used for different IC chips, and inconsistencies may be eliminated between chip and circuit designers on how variant layer changes are to be designated. Errors in revision and variant tracking may also be reduced or substantially eliminated by implementing the disclosed labeling system and methods in an automated manner, while also allowing for additional tracking and verification through monitoring scripts. Moreover, circuitry errors in a semiconductor device may be reduced by ensuring that the correct combination of masks correspond to the intended die.

In one exemplary embodiment, the disclosed systems and methods may be implemented to provide a central library for storage of parameterized cells, and using central cells and identical identification and tracking methodology for a variety of different types of IC technologies. In another exemplary embodiment, an IC layer identification and tracking system may be implemented using at least one processing device (e.g., such as Intel or AMD-based host CPU of a computer workstation or other configuration of non-portable or portable computer system) to display on a coupled display device a graphical user interface (GUI) which provides a user (e.g., circuit or chip designer) with an "at-a-glance" state of IC layer revision settings for a given IC design. A further embodiment may be implemented to allow a script to perform data extraction of the revision settings from a project database, graphic database system (GDS) file such as GDSII file, or other suitable EDA photomask layout data file such as open artwork system interchange standard (OASIS) data file.

The disclosed systems and methods may be advantageously implemented in one exemplary embodiment to reduce the potential for human error during IC design and revision process by ensuring that all necessary IC design components and PCells get places, and that they are programmed correctly. In a further embodiment, the disclosed systems and methods may be advantageously implemented to reduce the time that is required for a foundry engineer to confirm that changes have been correctly applied to an IC part when viewing the fractured data (e.g., fractured data review of mask reticle data). In yet another embodiment, a numeric or alphabetic "mini-character" may be included in a layerID PCell to uniquely identify the circuit layer being viewed independent of any other identifier character that is employed by the semiconductor fabrication plant or foundry (FAB). In yet another embodiment, layerID PCells and BooleanID PCells may be visually inspected in completed chip devices, e.g., by de-capping and polishing a semiconductor chip device to expose the layerID PCells and BooleanID PCells so that the identity of circuit layers and layer revisions may be read from the completed device. This may be performed, for example, to identify layers of failed parts for trouble shooting and failure analysis purposes.

In one respect, disclosed herein is an integrated circuit (IC) device die, including: multiple stacked layers that each include a respective circuit pattern; where each given layer of at least a selected portion of the multiple stacked layers further includes at least one visible label disposed on an upper surface of the given layer adjacent the respective circuit pattern of the given layer, the visible label including at least one layer revision identifier selected to identify the current revision of the respective circuit pattern that corresponds to the given one of the selected individual layers of the IC independent of the current revision of the circuit pattern of other individual layers of the IC.

In another respect, disclosed herein is a photomask defining an individual layer of a multi-layer integrated circuit (IC), including: a given circuit pattern corresponding to the individual layer of the IC; and at least one layer revision identification parameterized data cell (layerID PCell) corresponding to the individual layer of the IC. The layerID PCell may include at least one visible layer revision identifier that identifies a current revision of the given circuit pattern of the individual layer of the IC that is independent of the current revision of the circuit pattern of other individual layers of the IC.

In another respect, disclosed herein is a method of providing layer identification information for at least one individual layer of a multi-layer integrated circuit (IC). The method may include using at least one processing device to: receive a user selection of at least one layer revision identifier to identify a current revision of a given circuit pattern of a selected individual layer of the IC, the selected layer revision identifier being independent of the current revision of the circuit pattern of other individual layers of the IC; respond to the user selection by creating at least one layer revision identification parameterized data cell (layerID PCell) corresponding to the selected individual layer of the IC, the layerID PCell including the selected layer revision identifier; access a data file stored in a storage device that is coupled to the processing device to retrieve a data cell that contains multiple circuit patterns for respective multiple layers of the IC, the multiple layers of the IC including the given circuit pattern of the selected individual layer of the IC; and add the created layerID PCell to the retrieved data cell to create a layout data file corresponding to a photomask that includes a combination of the created layerID PCell and the given circuit pattern within the selected individual layer of the IC.

BRIEF DESCRIPTION OF THE DRAWINGS

FIG. 3 illustrates a nomenclature system according to one exemplary embodiment of the disclosed systems and methods.

DESCRIPTION OF ILLUSTRATIVE EMBODIMENTS

Figure 1A:
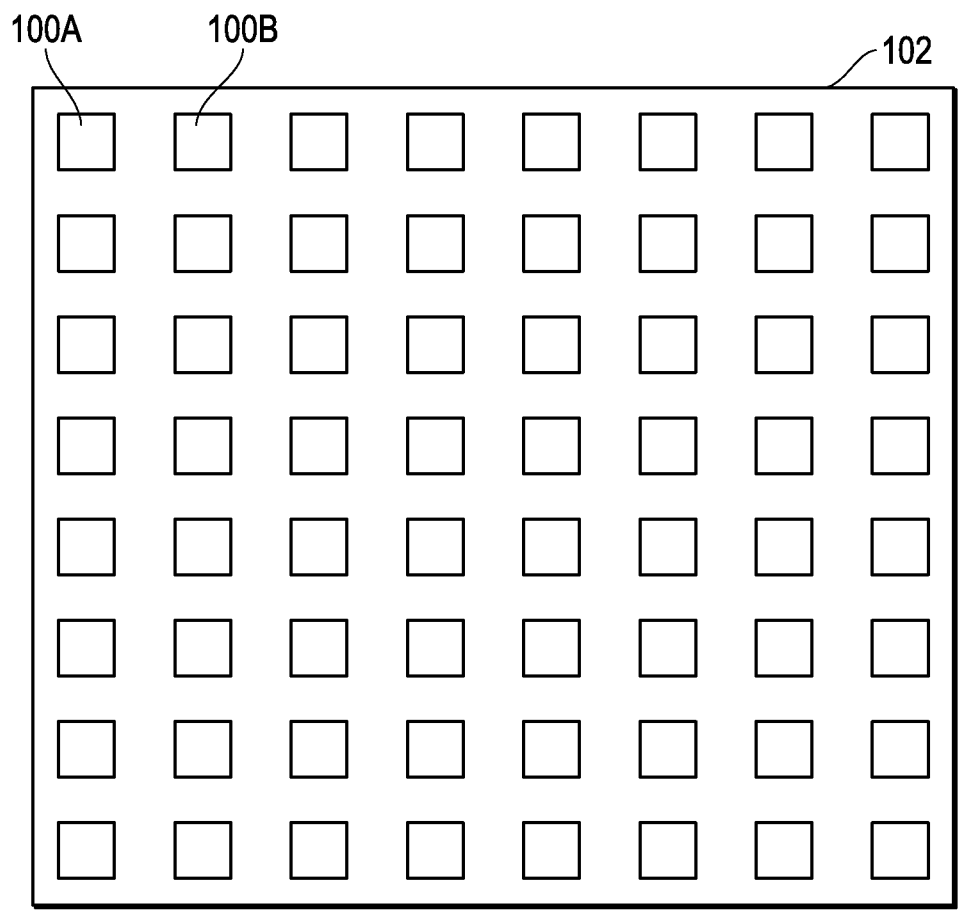
FIG. 1A is an overhead view of a photomask including multiple different circuit designs according to one exemplary embodiment of the disclosed systems and methods.
Figure 1B:
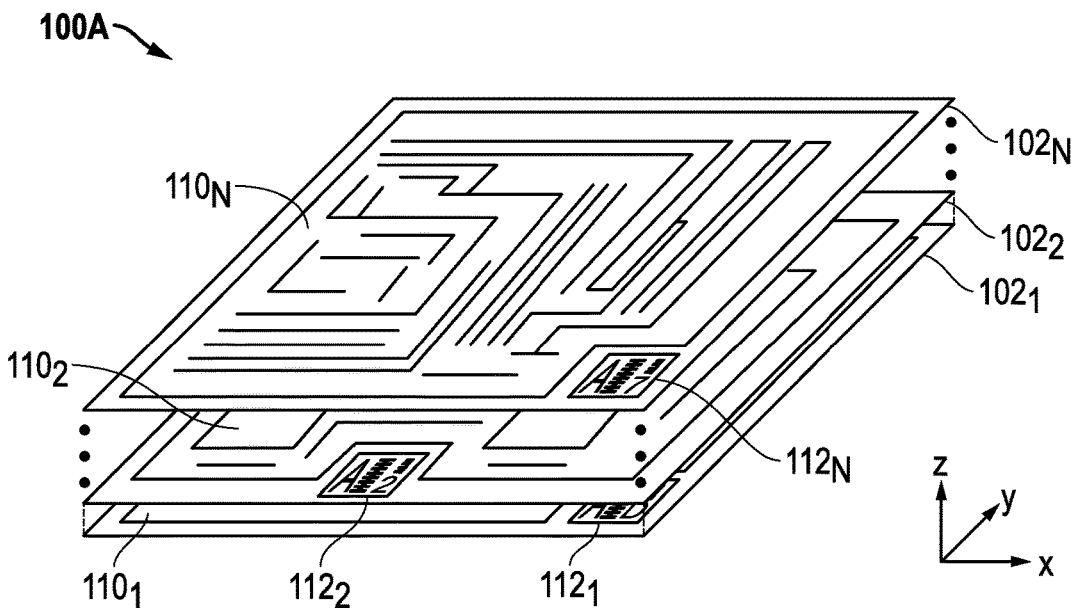
FIG. 1B is an exploded partial perspective illustration of an individual circuit design according to one exemplary embodiment of the disclosed systems and methods.
Figure 1C:
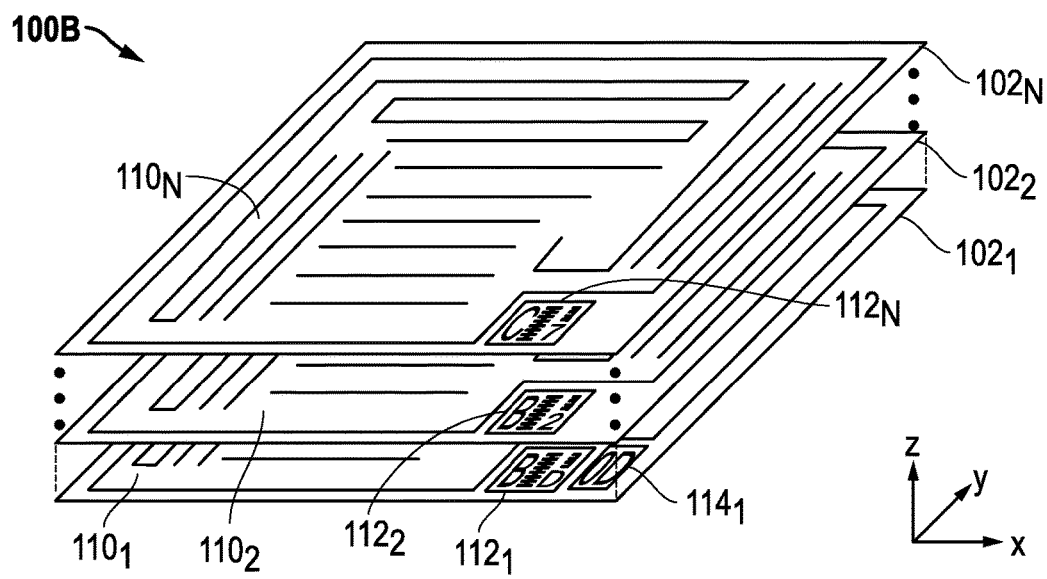
FIG. 1C is an exploded partial perspective illustration of an individual circuit design according to one exemplary embodiment of the disclosed systems and methods.
Figure 2:
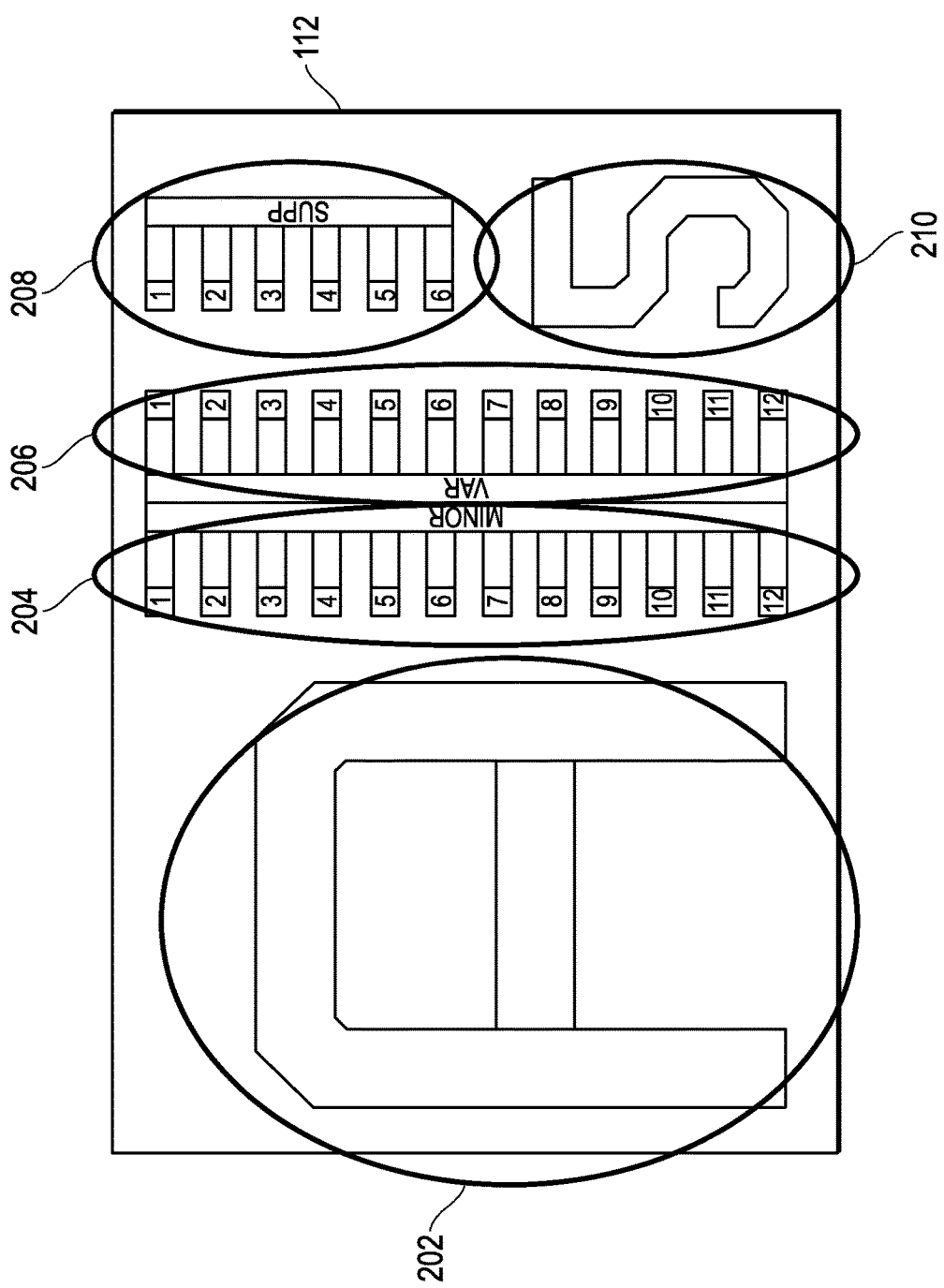
FIG. 2 illustrates a layerID PCell according to one exemplary embodiment of the disclosed systems and methods.
Figure 12:
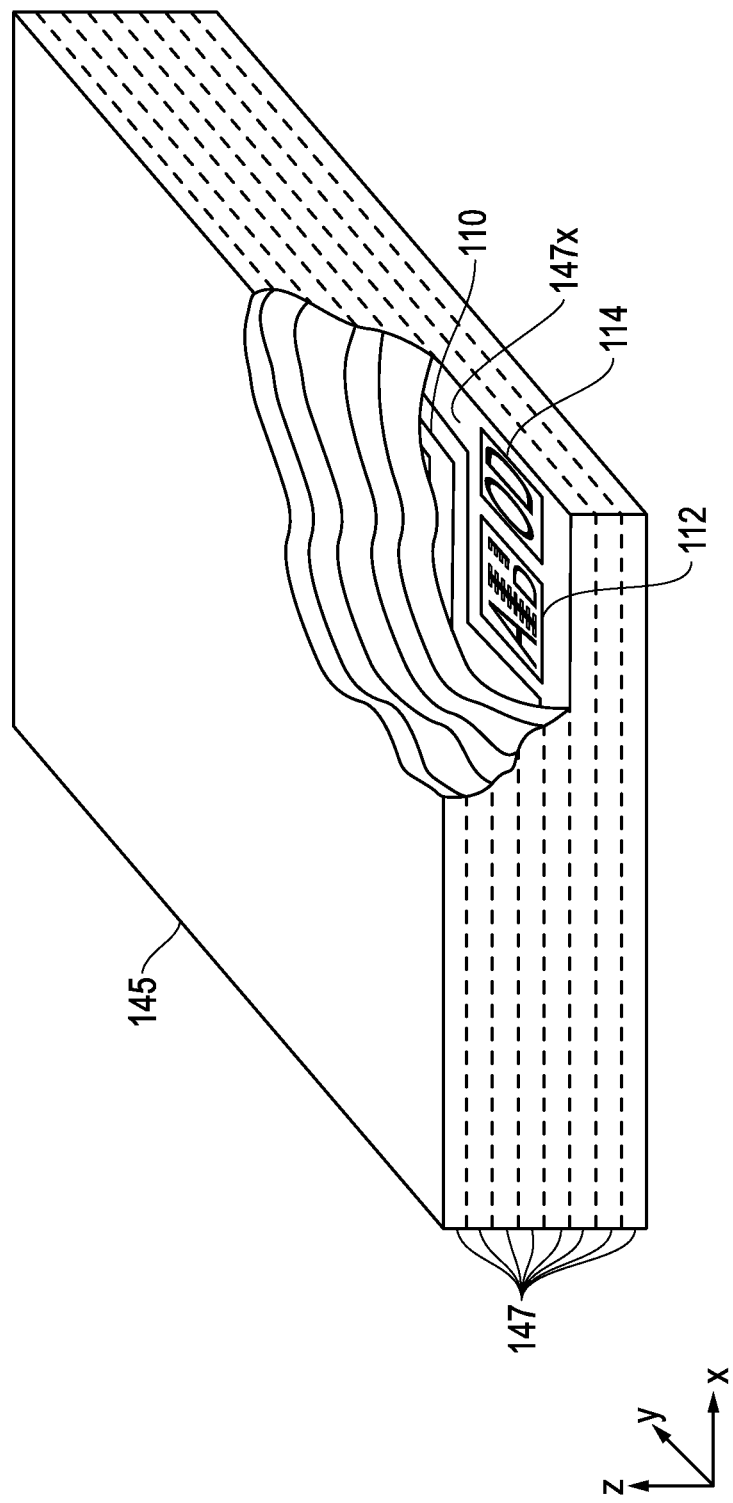
FIG. 12 illustrates a semiconductor die according to one exemplary embodiment of the disclosed systems and methods.

FIG. 1A illustrates one embodiment of a stack of aligned photomask layers 102 including IC patterns corresponding to multiple circuit IC designs 100A, 100B, etc. Each of photomask layers 102 may be created, for example, using electronic design automation (EDA) software design tools such as GDS or Oasis. As described below, each of FIGS. 1B and 1C illustrates an exploded perspective partial view of the aligned stacked photomasks 102 of FIG. 1A that corresponds to a single semiconductor die 145 to be manufactured as shown in FIGS. 2 and 12. More particularly, FIG. 1B illustrates one embodiment of an IC design 100A for a single semiconductor die 145 that is formed from multiple reticles or photomasks $102_1$ to $102_N$ such as illustrated in FIG. 1A, and FIG. 1C illustrates one embodiment of an IC design 100B for a single semiconductor die 145 that is formed from multiple reticles or photomasks $102_1$ to $102_N$ such as illustrated in FIG. 1A. X-Y-Z axis orientations used herein relative to given circuit design 100 (and die 145) are denoted in FIGS. 1B, 1C and 12. Although circuit designs are described herein in relation to a single IC design 100A or 100B, it will be understood that multiple such circuit designs 100 may be formed by a stack of photomask layers that defines multiple different semiconductor devices 145 such as illustrated in FIG. 1A. For example, IC design 100A may be a different circuit design than IC design 100B, IC design 100B may be a variant revision of IC design 100A, etc. However, in another exemplary embodiment, all IC designs 100 of the aligned stacked photomasks 102 may be copies of the same circuit design.

As shown in FIG. 1B, each of photomasks 102 includes a corresponding circuit pattern (e.g., metal layer, via, base layer, etc.) 110 together with a corresponding visible layerID PCell 112 that correspond to one of the stacked layers of the integrated circuit (IC) design 100. In this regard, each circuit pattern 110 may be written together with its layerID PCell 112 into a chrome layer on a fused silica or quartz substrate from the EDA data files to form one of photomasks 102. The X-Y location of a layerID PCell 112 on each photomask 110 relative to a circuit pattern 110 may vary as shown, and may be selected by a user, e.g., using input devices 162 of FIG. 1D and based on available open area and subject to design rule checking (DRC). As part of a semiconductor fabrication process, these photomasks 102 may be loaded into a stepper or scanner for exposing the semiconductor material to radiation during a photolithography process to manufacture an IC device die 145 corresponding to IC design 100 as shown in FIG. 12. As will be described further herein, the circuit pattern 110 of one or more of photomasks 100 may be changed over time, e.g., as a revision, variant or supplement. Moreover, although possible, it is not necessary that a layerID PCell 112 be included on every circuit layer photomask 102 of an IC design 100. Rather in some embodiments, only those photomasks 102 corresponding to layers including particular selected types of circuit patterns (e.g., such as diffusion, poly, contact, and metal layers) may include a layerID PCell 112 and not photomasks corresponding to layers including other types of patterns (e.g., implant, etc.).

FIG. 1C illustrates an IC design 100B according to an alternative embodiment. In this embodiment, each of photomasks 102 includes a corresponding circuit pattern 110 together with a corresponding layerID PCell 112 that correspond to one of the stacked layers of the IC design 100. As shown in the embodiment of FIG. 1C, certain photomasks may also include a separate Boolean operation identifier PCell (BooleanID PCell) 114 that may be present to denote relationship between different layers where Boolean operations may be performed (e.g., by a mask shop) after the initial circuit layer design to create a logically-derived layer prior to chip fabrication. For example, in FIG. 1C, BooleanID PCell $114_1$ present in the IC design 100 creates the letters "OD" on the active diffusion photomask. In one exemplary embodiment, BooleanID PCells 114 are drawn so that predetermined characters will appear on different photomask 102 only when the Boolean operation is executed correctly. Such a configuration may be employed to allow for visual inspection and recognition that the Boolean operations were performed as expected by a foundry maskshop subsequent to the original design and before semiconductor fabrication, e.g., such as to confirm relation between layers OD and active area n-type diffusion (aan)/active area p-type diffusion (aap), between lightly-doped drain implants (LDD), between pplus(p+)/nplus(n+) implant layers, between high voltage threshold (HVT)/low voltage threshold (LVT) layers, etc.

Figure 1D:
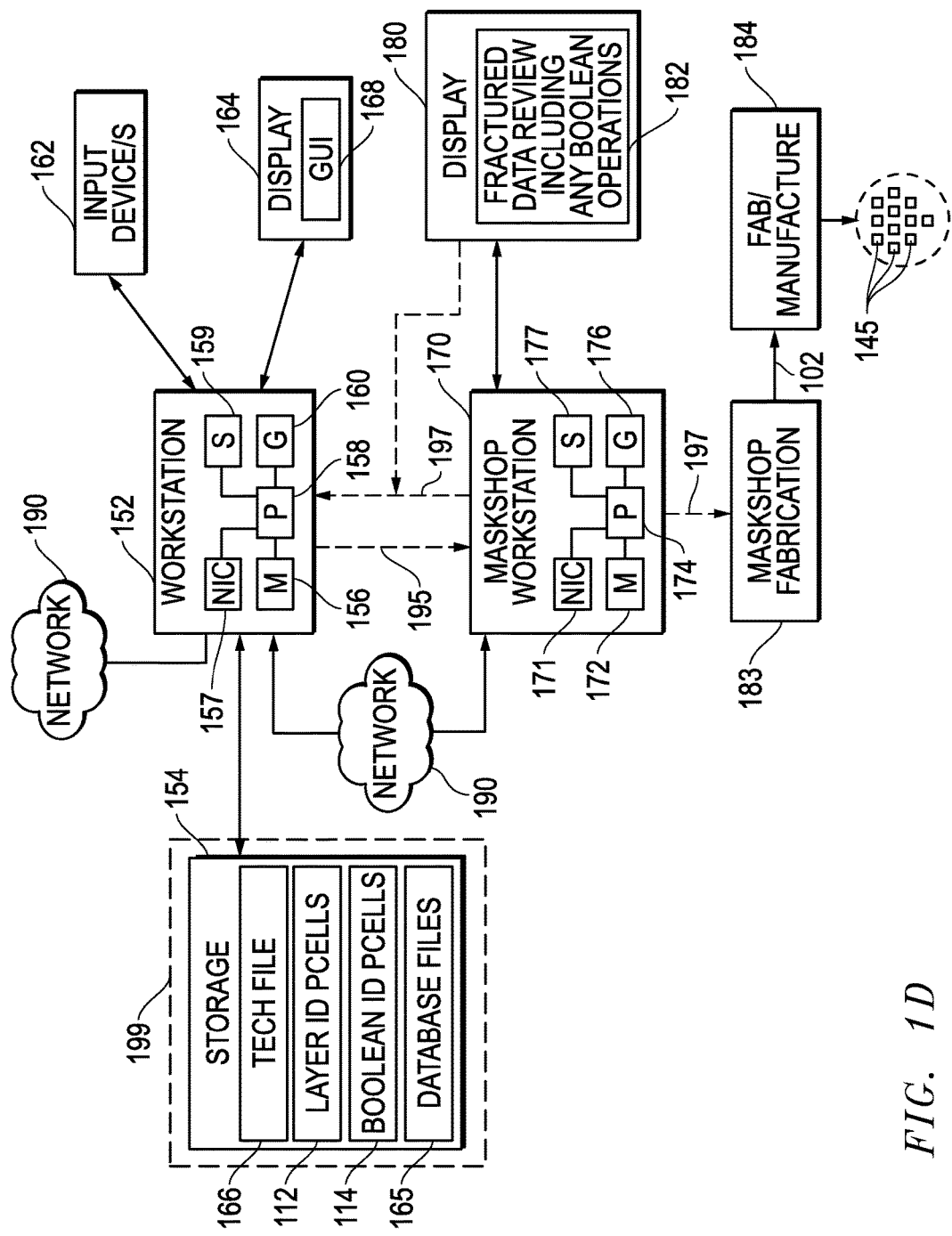
FIG. 1D illustrates relationship between systems that may be employed to identify and track layer changes according to one exemplary embodiment of the disclosed systems and methods.

FIG. 1D illustrates relationship between systems that may be employed in one exemplary embodiment to identify and track layer changes (e.g., revisions, variants, supplements, etc.) of an integrated circuit (IC) device, e.g., during any one of circuit design, pattern generation, device fabrication and/or chip failure analysis processes. As shown a chip designer computer system 152 may be provided in the form of a workstation (or other suitable stand-alone or network computing system such as desktop computer, notebook computer, etc.) and employed during the chip design process. In this embodiment chip designer computer workstation 152 includes at least one host processing device 158 (e.g., AMD or Intel-based CPU or any other type of suitable host processing device) that is configured to perform one or more of the layer change identification and tracking tasks described herein. As further shown, host processing device 158 is coupled to system volatile memory 156 (e.g., DRAM) for use by processing device 158 during processing tasks, and also to video/graphics hardware 160 (e.g., video adapter or graphics processor unit) that is coupled to provide images (e.g., including graphic user interface "GUI" 168) to a display device 164 (e.g., LCD or LED display) based on data provided from host processing device 158. Input devices 162 (e.g., keyboard, mouse, touchpad, etc.) are also coupled for receiving input from a user for host processing device 158, it being understood that display device 164 may additionally function in one embodiment as a touch screen input device for accepting input from a user. Additionally a network interface controller (NIC) 157 may also be optionally present and communicatively coupled to a network 190 (e.g., Internet or corporate intranet) as shown to allow various components of computing system 152 to communicate data and other information with external and/or remote devices.

Still referring to FIG. 1D, chip designer computer system 152 is coupled in this embodiment to retrieve or access tech file 166, layerID PCells 112 and BooleanID PCells 114 that are stored in a centralized library 199, e.g., on one or more external storage device/s 154 such as external hard disk drive or solid state drive, external storage system (RAID, NAS, SAN storage), etc. It will be understood that files 165, 166, 112 and 114 may alternatively be retrieved or accessed from across network 190 or from internal storage 159 (e.g., internal hard disk drive or solid state drive). Photomask database layout files 165 may include EDA photomask layout data file/s containing circuitry patterns for circuit design/s 100 that have been previously created for one or more photomasks 102 by a chip designer. In one exemplary embodiment, a user may utilize GUI 168 and/or input devices 162 to utilize processing device 158 to run EDA software (e.g., GDS or Oasis) to edit the EDA photomask layout database file/s 165 to add an appropriate layerID PCell 112 and/or BooleanID files 114 to one or more of individual photomasks 102 that includes the appropriate identification information corresponding to the current revision and identity of the given photomask 102 (in a manner described further herein).

FIG. 1D also illustrates a computing system 170 configured as a Fab maskshop workstation that may include similar components (performing similar functions) as described for computing system 152, e.g., host processing device 174, system volatile memory 172, video/graphics hardware 176, display device 180, input devices 162, NIC 171, and internal storage 177. Fab maskshop computing system 170 may in one embodiment be located at a separate geographic location from computing system 152, although this is not necessary. In one exemplary embodiment maskshop computing system 170 may be operated by a semiconductor foundry or fabrication company at a second geographic location, while computing system 152 may be operated by a chip design company at a first and different geographic location (e.g., in a different city, state or country). In any case, computing system 152 and maskshop computing system 170 may be optionally coupled to exchange data and other information across network 190 as shown, or may alternatively exchange data and information in any other suitable manner. In this regard, the combined information (database files 165, layerID Pcells 112, Boolean Pcells 114) may be provided to computing system 170 from computing system 152 in the form of files 195 as described below.

In the embodiment of FIG. 1D, computing system 152 may provide edited EDA photomask layout data file/s 195 (i.e., edited to include appropriate layerID PCells 112) to maskshop workstation 170, where a maskshop user may use processing device 174 to process and separate the individual chip design layers of photomasks 102 and, where appropriate, perform Boolean operations on EDA photomask layout data file/s 165 corresponding to one or more Boolean layer files 114 to the existing layer design information of the edited EDA photomask layout data file/s 195 provided from workstation 152 to create maskshop EDA photomask layout data file/s 197 that include the layer data from data file/s 195 together with the added data for derived or Boolean data layers. Resulting maskshop EDA photomask layout data file/s 197 may be viewed using fractured data review application interface 182 on maskshop display 180, or in any other suitable manner. In one embodiment, maskshop EDA photomask layout data file/s 197 may be optionally provided back as shown to a chip designer computer system 152 where the maskshop EDA photomask layout data file/s 197 may be reviewed and approved or rejected for further revision, e.g., using fractured data review application interface 182 on computing system 152. In one embodiment, photomask layout data file/s 195 and/or maskshop EDA photomask layout data file/s 197 may also be optionally stored by computing system 152 in a database on storage 154 of centralized library 199.

In any case, once approved, the maskshop EDA photomask layout data file/s 197 are provided as shown to a maskshop fabrication facility 183 for photomask creation. The finished photomasks 102 are then shipped from the maskshop fabrication facility 183 to a FAB/manufacture facility 184 (e.g., CMOS or other type of semiconductor fab) for chip manufacture to produce multiple semiconductor dies 145 having layers derived from photomasks 102 (e.g., which may be created from a pattern that is generated and written into a chrome layer on a fused silica or quartz substrate from photomask layout data file/s 197 that include circuit patterns 110, layerID PCells 112 and BooleanID PCells 114 for each layer 102). Each die 145 may include an individual circuit design 100 that is formed from stacked circuit layers 147 corresponding to the photomask layers 102 of one of the multiple circuit designs (e.g., 100A, 100B, etc.), layerID PCells 112 and BooleanID PCells 114 of FIGS. 1A-1C. FIG. 12 illustrates a perspective cut-away view of one exemplary embodiment of such a semiconductor die, showing labels corresponding to layerID PCell 112 and BooleanID PCell 114 as they are visible on a given exposed circuit layer $147_X$, such as during failure analysis when layers that overlie circuit device layer $147_X$ have been removed by polishing or other suitable layer removal technique. As shown, the X-Y location of the layerID PCell 112 and BooleanID PCell 114 on exposed circuit layer $147_X$ is in the lower right hand corner of exposed circuit layer $147_X$, it being understood that one or more other layers 147 of die 145 may also include respective labels corresponding to an appropriate layerID PCell 112 and/or BooleanID PCell 114 that are similarly visible when their respective layer 147 is similarly exposed.

It will be understood that the embodiment of FIG. 1D is exemplary only, as are the particular internal components of workstations 152 and 170 and the external components coupled to workstations 152 and 170. Moreover it is also possible that all of the editing of EDA photomask layout data file/s 197 may be performed on a single computing system and/or at a common (same) geographic location.

Figure 7:
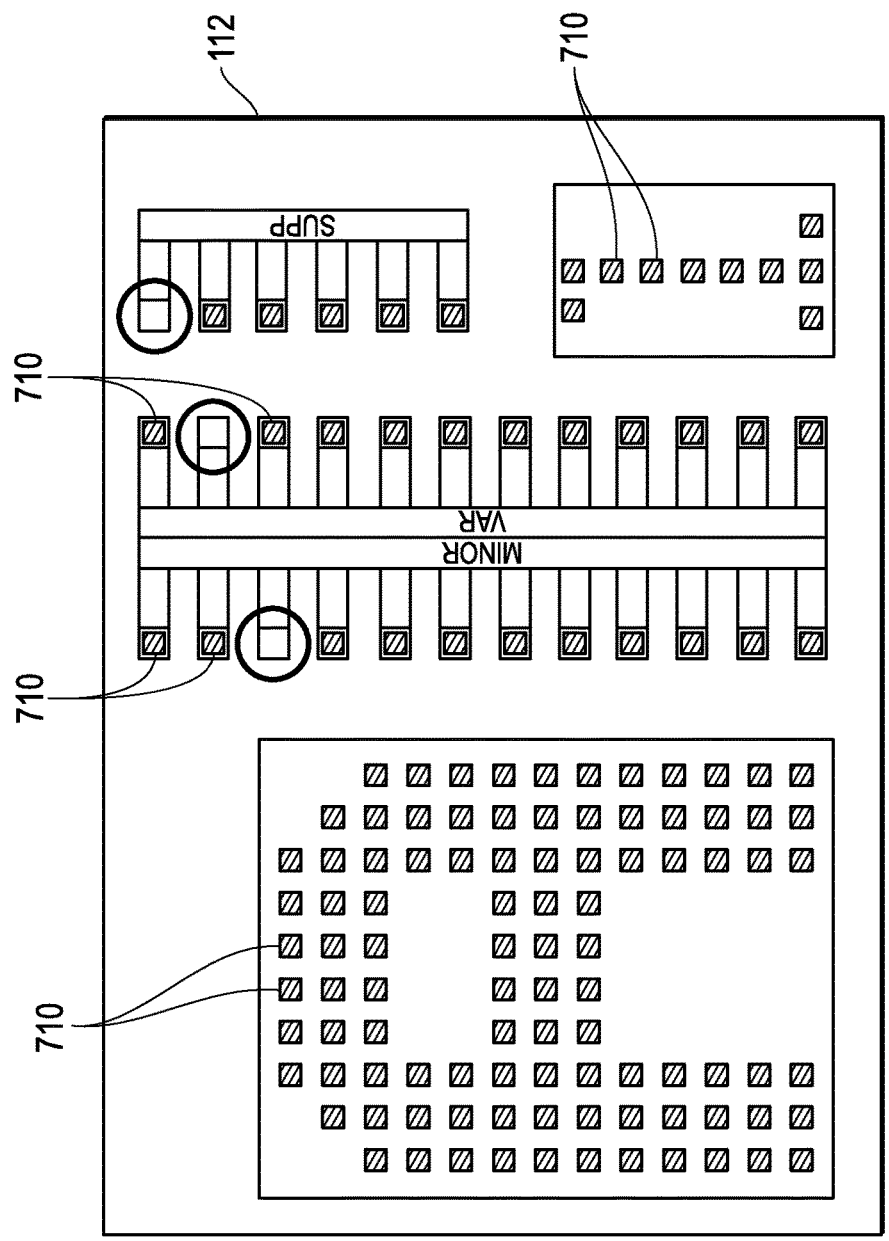
FIG. 7 illustrates a layerID PCell according to one exemplary embodiment of the disclosed systems and methods.
Figure 8:
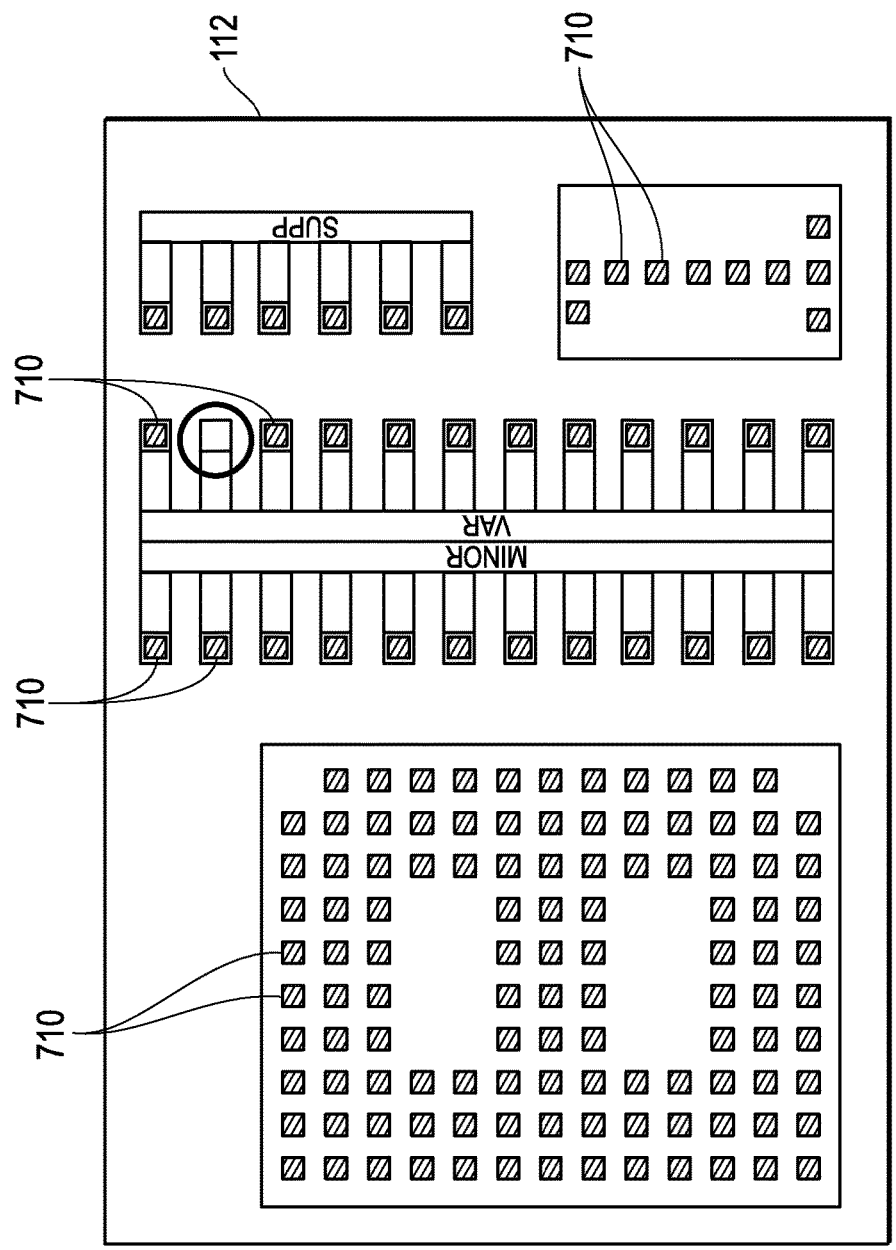
FIG. 8 illustrates a layerID PCell according to one exemplary embodiment of the disclosed systems and methods.
Figure 9A:
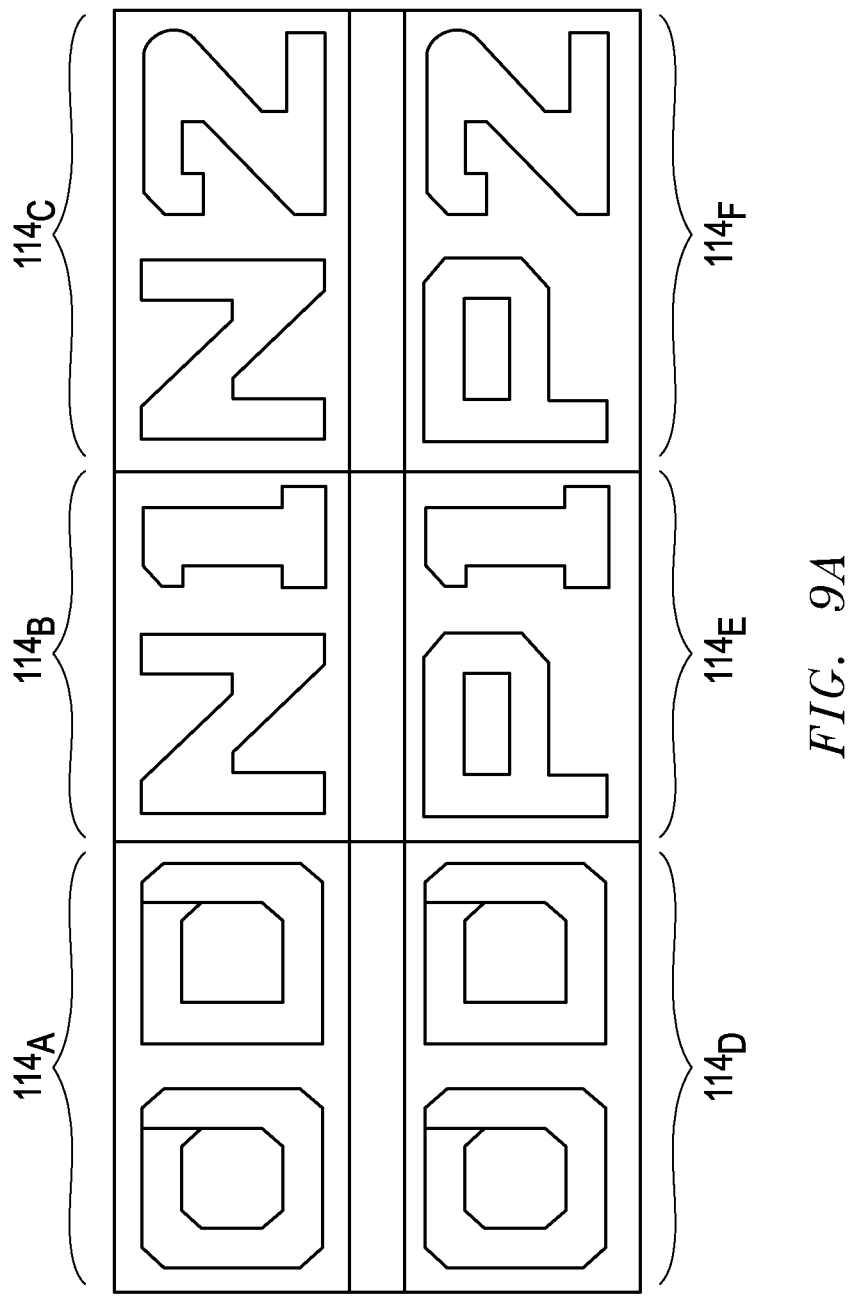
FIG. 9A illustrates an example stacking of BooleanID PCells according to one exemplary embodiment of the disclosed systems and methods.
Figure 9B:
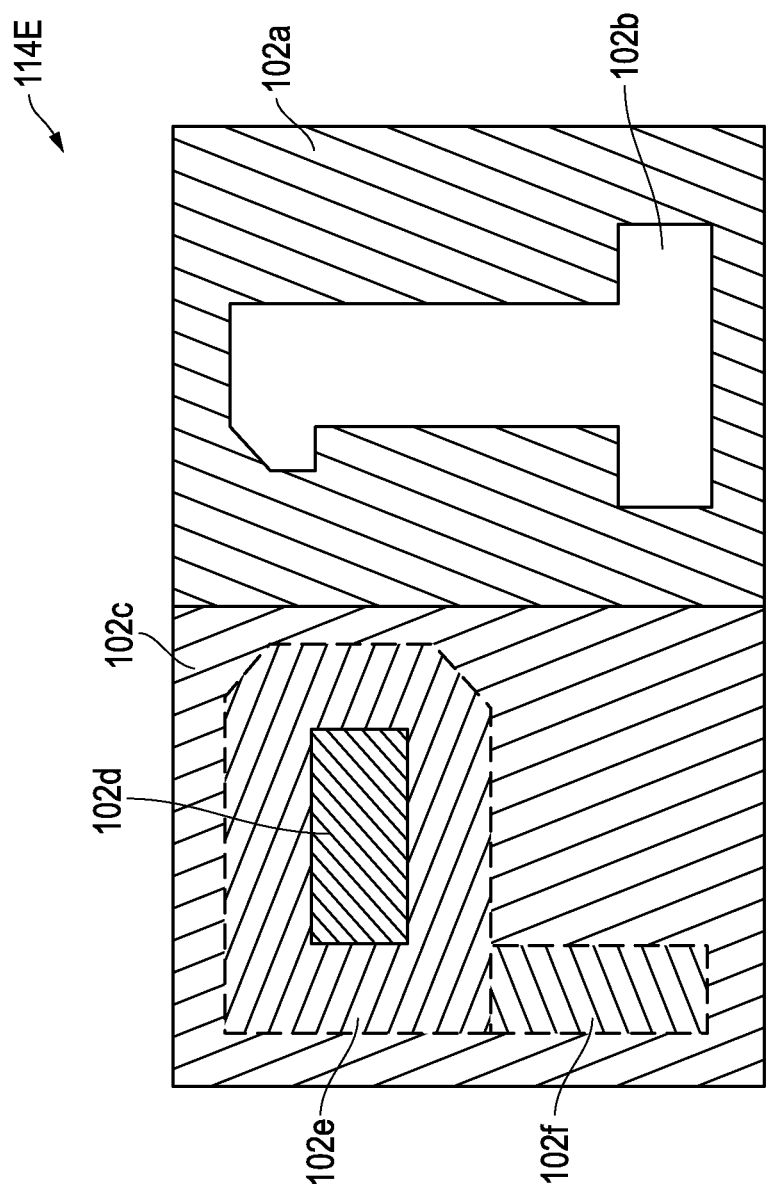
FIG. 9B illustrates an example stacking of BooleanID PCells according to one exemplary embodiment of the disclosed systems and methods.

FIG. 2 illustrates one exemplary layerID PCell 112 such as may be included in one of photomasks 102 of FIG. 1B or 1C and employed to track revisions, variants and supplements to the chip design. FIG. 3 illustrates one exemplary embodiment of a nomenclature system for identifying and tracking IC layer changes using layerID PCells 112. FIGS. 4-8 illustrate example configurations of layerID PCell 112, e.g., as they may be created by an operator using GUI 168 of computing workstation 152. FIG. 9A illustrates an example positioning of six BooleanID PCells $114_A$ to $114_F$ as these may be viewed corresponding layer 102. BooleanID PCells $114_A$ to $114_F$ are abutted in relation to each other in a manner similar to that illustrated in FIG. 9A. Each section 114A, 114B, 114C, 114D, 114E and 114F of the BooleanID Pcells of FIG. 9A is made up of multiple layers. For example, section 114E is made up of multiple layers 102a, 102b, 102c, 102d, 102e and 102f as shown in FIG. 9B for section 114E, and which in this example form the derived layer 114E of FIG. 9A which then may be viewed during the mask and fractured data review, with other sections 114A, 114B, 114C, 114D and 114F being similarly formed as derived layers from various multiple drawn layers which may be different than 102a, 102b, 102c, 102d, 102e and 102f. The Boolean Pcell 114 is used to prove that undrawn layers that are derived from drawn layers in the Boolean operations performed at the maskshop are done correctly.

Referring now to FIG. 2, LayerID PCell 112 of FIG. 2 is annotated to include a legend or map to one exemplary embodiment of labeling nomenclature that may be implemented according to the disclosed systems and methods to identify and track such changes. The various components of layerID PCell 112 (e.g., revision identifiers and layer identification identifier) may be displayed on graphical user interface (GUI) 168 or mask and fractured data review software application display 182 of FIG. 1D (e.g., such as "E JOB VIEW®" available from Taiwan Semiconductor Manufacturing Co., Ltd. of Hsinchu, Taiwan), where they may be viewed to determine the current revision of the chip design 100 as will be described further herein. In one embodiment, such mask and circuit review software may be accessed through the maskshop website in a secure manner to confirm that the photomask data is correct before creating the physical masks and incurring the expense therein. Errors found during fractured date review may be fixed by the customer and/or maskshop and a new mask and circuit review software file created. When no errors are found approval may be given to proceed with physical mask making. During this review process using mask and circuit review, a foundry engineer may check that the correct EDA databases were used, that the layers were mapped correctly (e.g., M1 drawing layer to M1 photomask), that each die inside the reticle die array is the correct revision and variant, that the die orientation is correct, and that the layer Boolean operations are as expected.

In the exemplary embodiment of FIG. 2, a "major" revision identifier 202 is provided as a large capital alphabetic letter in the layerID PCell 112. A "major" revision to a chip circuit may be selected in one embodiment to include changes made to all layers 102 (or alternatively made to a significant number of layers 102) of a chip design 100, including changes made to base layers (e.g., polysilicon, diffusion, n-well, p-well, etc.) of the chip as well as to the other layers (e.g., metal layers, via layers, etc.). In one embodiment, a "major" revision may also be selected to characterize any other revisions that result in major significant design changes within the chip. Thus, the "major" revision identifier 202 of a given chip design may progress with each major revision made to the chip design, e.g., from original chip design "A", to first major revision "B", to third major revision "C", etc. as illustrated in the first column of the table of FIG. 3. It will be understood that a major revision identifier need not be alphabetic as shown, but may be any other selected suitable system of characters for identifying major revisions including, for example, a comb structure such as employed in FIG. 2 for minor, variant and supplement revisions, a numeric character system such as employed for layer identification purposes in FIG. 2, etc. It will further be understood that a "major" revision identifier 202 may be assigned to encompass a given scope of changes (e.g., made to all layers, made to greater than or equal to a certain threshold fraction of all circuitry of the given layer, to include only changes of a given type, etc.) as desired for a given application.

Figure 4:
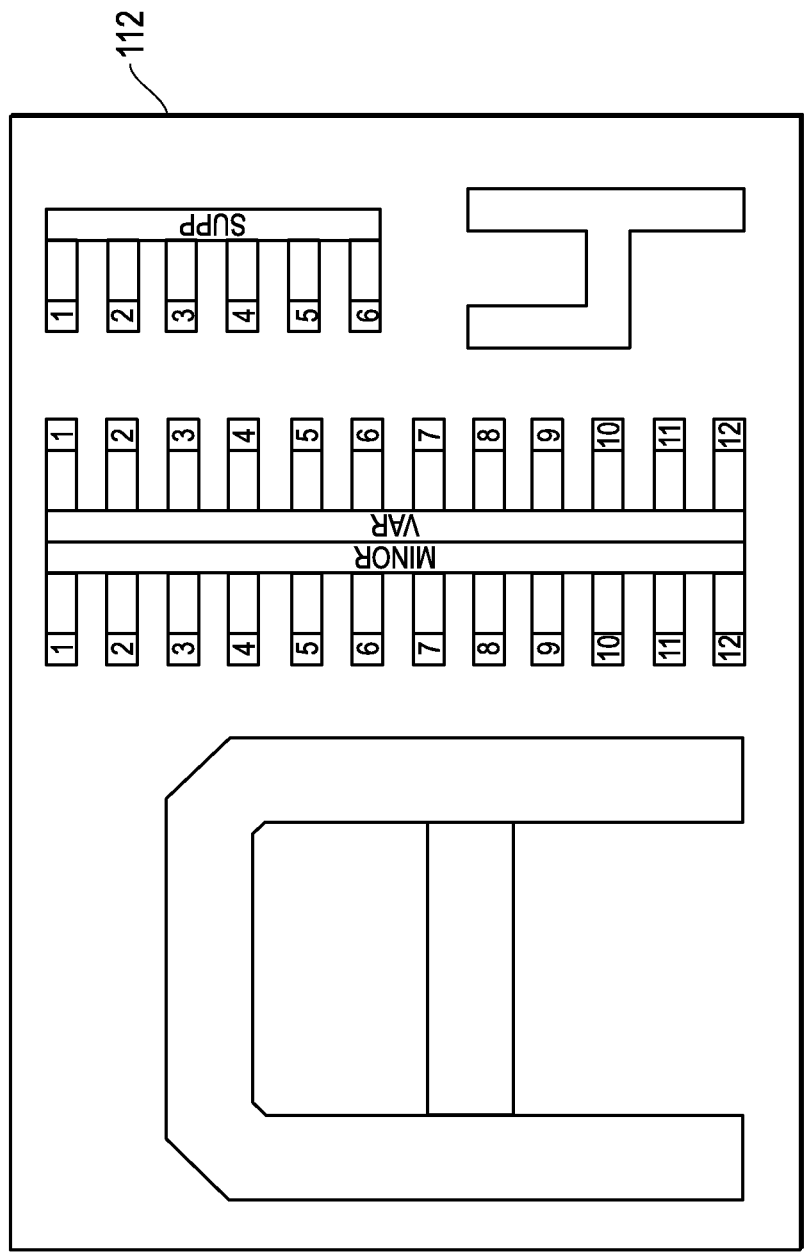
FIG. 4 illustrates a layerID PCell according to one exemplary embodiment of the disclosed systems and methods.
Figure 5:
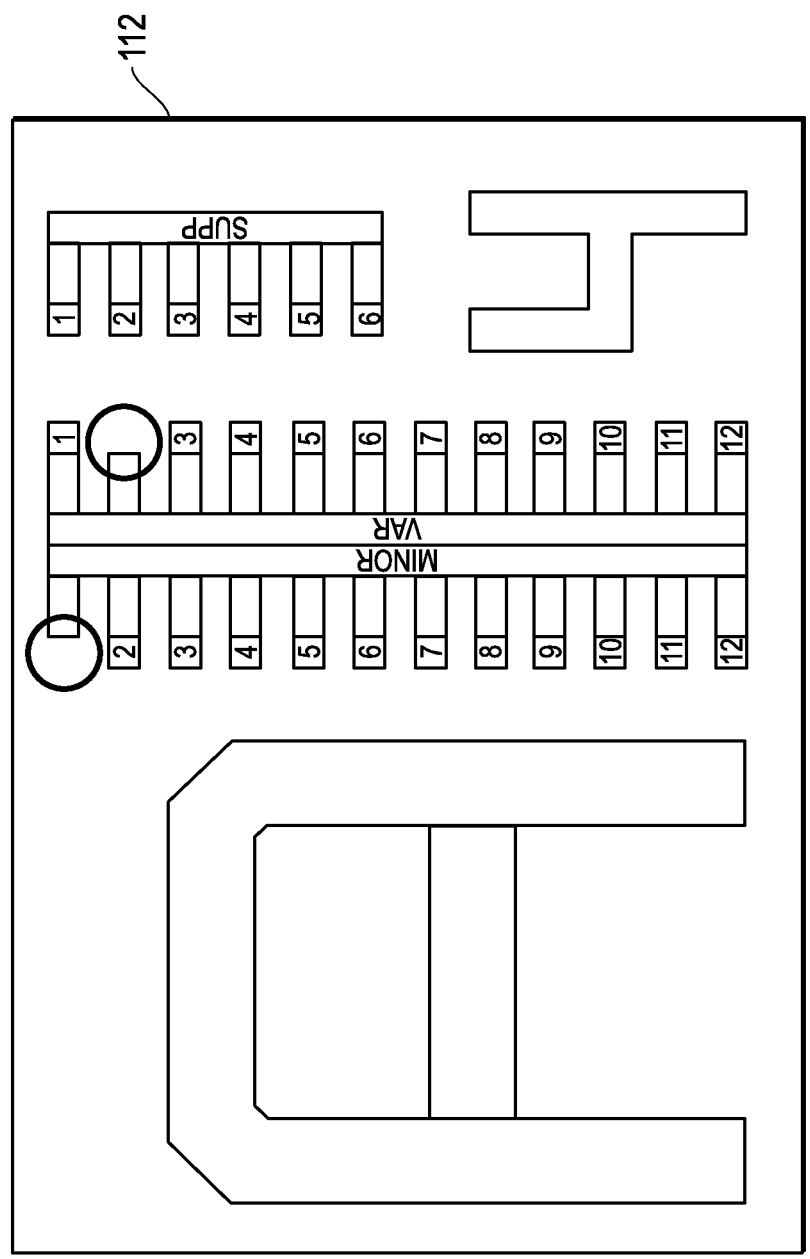
FIG. 5 illustrates a layerID PCell according to one exemplary embodiment of the disclosed systems and methods.

Still referring to FIG. 2, a "minor" revision identifier 204 may be provided as a comb structure in the layerID PCell 112 as shown. A "minor" revision to a chip circuit may be selected in one embodiment to include changes made to metal and/or via layers of the chip design 100 with no changes to any base layers, or alternatively with only a few changes to the base layers. In this embodiment, a single tab (or via 710 within a tab for a via layer) of the minor revision comb structure 204 may be removed to indicate which "minor" revision currently exists in the chip design 100, e.g., counting from the first tab at the top of the comb structure 204. Thus, all tabs present in the comb structure 204 indicate a "0" (zero) revision to the design (i.e., no revisions have been made to the chip design 100) as illustrated in FIG. 4; whereas only a missing first (topmost) tab such as illustrated in FIG. 5 indicates a first revision has been made to the chip design 100, only a missing second tab indicates a second revision has been made to the chip design (e.g., additional revision after the first revision), etc. Each time the minor revision progresses to the next revision, the previous missing tab is replaced so that only the current minor revision tab is removed as illustrated in the second main column of FIG. 3. It will further be understood that in one embodiment a "minor" revision identifier 204 may be assigned to encompass a given scope of changes that is different and/or less in scope than assigned to the major revision identifier 202 (e.g., such as when changes are made only to non-base layers, are made to less than the certain threshold fraction of all circuitry of the layer, to include only changes of a given type, etc.).

As shown in FIG. 2, a "variant" revision identifier 206 may be provided in one embodiment as a comb structure in the layerID PCell 112. A "variant" revision to a chip design 100 may be selected in one embodiment to include changes made to any one or more of the layers of a chip design to create an alternative versions of a chip design 100 (for evaluation or production) that may or may not be manufactured on a limited basis. Just to illustrate, examples of variant revisions include changes in pad to ground current path or changes to resistor path within a given metal layer (e.g., metal layer 2) of the chip design 100. In the illustrated embodiment, a single tab (or via 710 within a tab for a via layer such as illustrated in FIGS. 7 and 8), of the variant revision comb structure may be removed to indicate which "variant" revision exists in the current chip design 100, e.g., counting from the first tab at the top of the comb structure 206. Thus, if all tabs (or vias 710 for via layer) are present in the comb structure 204 it indicates a "0" (zero) variant to the design (i.e., not a variant revision of the chip design 100) as illustrated in FIG. 4; whereas only a missing second (second from the top) tab indicates a second variant revision has been made to the chip design 100 as illustrated in FIG. 5, etc. It will be understood that there may be several variants of a chip within a chip design having a single major and/or minor revision. In one embodiment, a variant revision identifier 206 may be used to track which layers are shared between different variants of the different chip revisions and which ones change between variants. Each time the variant revision progresses to the next revision, the previous missing tab (or via 710 within the tab for a via layer) is replaced so that only the current variant revision tab (or via 710 within the tab) is removed as illustrated in the third main column of FIG. 3.

Figure 6:
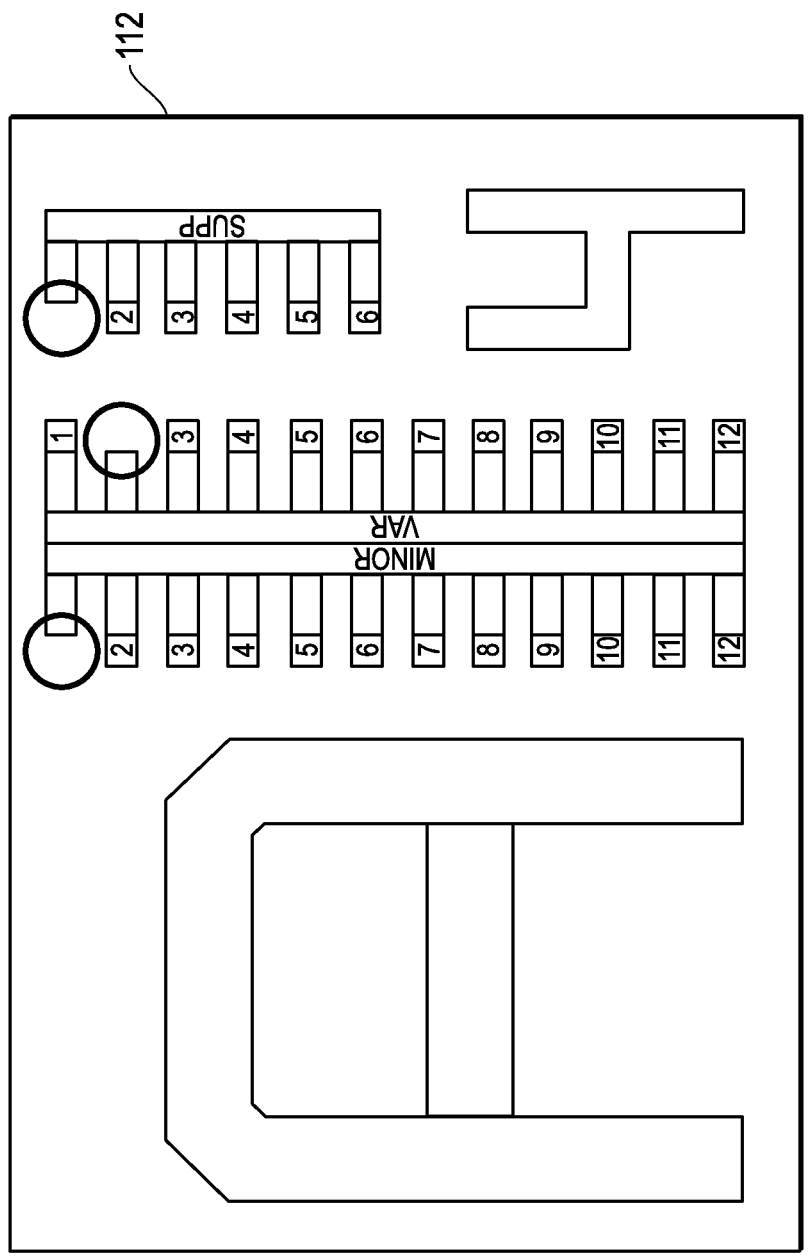
FIG. 6 illustrates a layerID PCell according to one exemplary embodiment of the disclosed systems and methods.

FIG. 2 also illustrates a "supplement" revision identifier 208 that may be provided in one embodiment as a third comb in the layerID PCell 112. A "supplement" revision to a chip design 100 may be selected in one embodiment to include changes made after an EDA database for the chip design 100 is sent from the design process to a mask shop of a semiconductor FAB or foundry, but before the masks or photomasks 102 have been released for manufacture. In the particular illustrated embodiment the supplement revision identifier 208 may have fewer tabs because it is typically used less frequently than the other revision identifiers 202, 204 and 206, however this is not necessary. In the illustrated embodiment, a single tab (or single via 710 within a tab for a via layer) of the comb structure 208 may be removed to indicate which "supplement", if any, currently exists in the layer of a given photomask 102. This tab (or via 710 within a tab for a via layer) will be replaced in a subsequent major and/or minor and/or variant revisions in which that layer changes, i.e., the supplemental comb structure 208 may be "zeroed out" with each new major and/or minor and/or variant revision for the given layer if it changes. Thus, if all tabs (or vias 710 within the tabs for a via layer) are present on the supplemental comb structure 208, this indicates that no supplemental database was generated such as illustrated in FIG. 4, or a first tab of the comb structure 208 may be removed to denote that the layer design of the current photomask 102 is a first supplement as illustrated in FIG. 6. Each time the supplement revision progresses to the next revision, the previous missing tab (or via 710 within the tab for a via layer) is replaced so that only the current supplement revision tab is removed as illustrated in the fourth main column of FIG. 3. It will be understood that in one embodiment major, minor, variant and/or supplement revision identifiers may correspond to respective revision of a given circuit pattern 110 of the same layer 102 independent of the circuit patterns 110 and revision identifiers of other layers 102 of the same IC design 100. Thus, in a further embodiment, it is possible that revision identifiers may differ from each other between one or more layers 102 of a given chip design 100 as shown for major revision identifiers of different layers in FIG. 1C.

Also shown provided within the layerID PCell 112 of FIG. 2 is a mini-character layer identifier 210 that may be provided as a polygon or group of particular polygon shapes that independently identifies which semiconductor layer (e.g., layer type and/or layer number in stack) is currently being viewed in a given photomask 102. To illustrate, if the layer of a given photomask 112 is metal 1, then mini-character identifier 210 may be provided as a polygon in the shape of a "1". As another example, if the layer of a given photomask 112 is metal 4, then mini-character identifier 210 may be provided as a polygon in the shape of a "4" as shown in FIG. 4. If the layer of a given photomask 112 is via 1, then mini-character identifier 210 may be provided as a grouping of multiple square-shaped polygons that are grouped in the shape of a "1" as shown in FIG. 7, in this case with comb structure including vias 710 within tabs of the comb. Examples of metals that may be used in CMOS for metal and via layers include, but are not limited to, aluminum, titanium, tantalum, tungsten, copper, etc. If the layer of a given photomask 102 is polysilicon or diffusion, then mini-character identifier 210 may be provided in the shape of a "P" or "D", respectively.

Use of such a mini-character identifier 210 allows an engineer or other user that is viewing the fractured data review interface 182 to confirm that the layer called up on the screen by the user was mapped to the correct mask or photomask 102. If the mini-character 210 is in the shape of a "4" indicating the user is viewing the metal 4 layerID PCell 112, but the user has selected metal 3 selected on the view screen, then the user knows that the layers have been mapped incorrectly. It will be understood that the particular polygon and polygon shapes assigned to indicate a particular type of layer (e.g., such as a via layer, etc.) may be defined as desired or appropriate to fit a given number of multiple different type layers to be indicated, e.g., round-shaped polygons, diamond-shaped polygons, etc. Moreover, in one exemplary embodiment a metal layer may be alternatively indicated by a grouping of multiple square-shaped polygons and a via layer indicated by a polygon in the mini-character shape of the layer number.

It will be understood that the particular combination of revision and layer identifiers of the layerID PCell 112 of FIG. 2 is exemplary only, and that any other combination of fewer or additional number of revision types may be identified and tracked in similar manner. Moreover, the types of layer identifiers (e.g., alphabetic, numeric, comb structure, etc.) may vary as desired for a given type of identifier, e.g., a major revision identifier may be alternatively implemented with a comb structure or numeric character, a minor revision identifier may be alternatively implemented with an alphabetic character or comb structure, etc. Additionally, the relative size, order and/or orientation of the different revision and layer identifiers may be varied, and it is also possible to employ different types and shape of comb structures (e.g., semi-circular or circular comb structure with radially inward or outward extending tabs) or other identifier structure including non-comb structures such as an array of empty squares with one solid square filled in corresponding to revision identity or vice-versa, etc.

Figure 10:
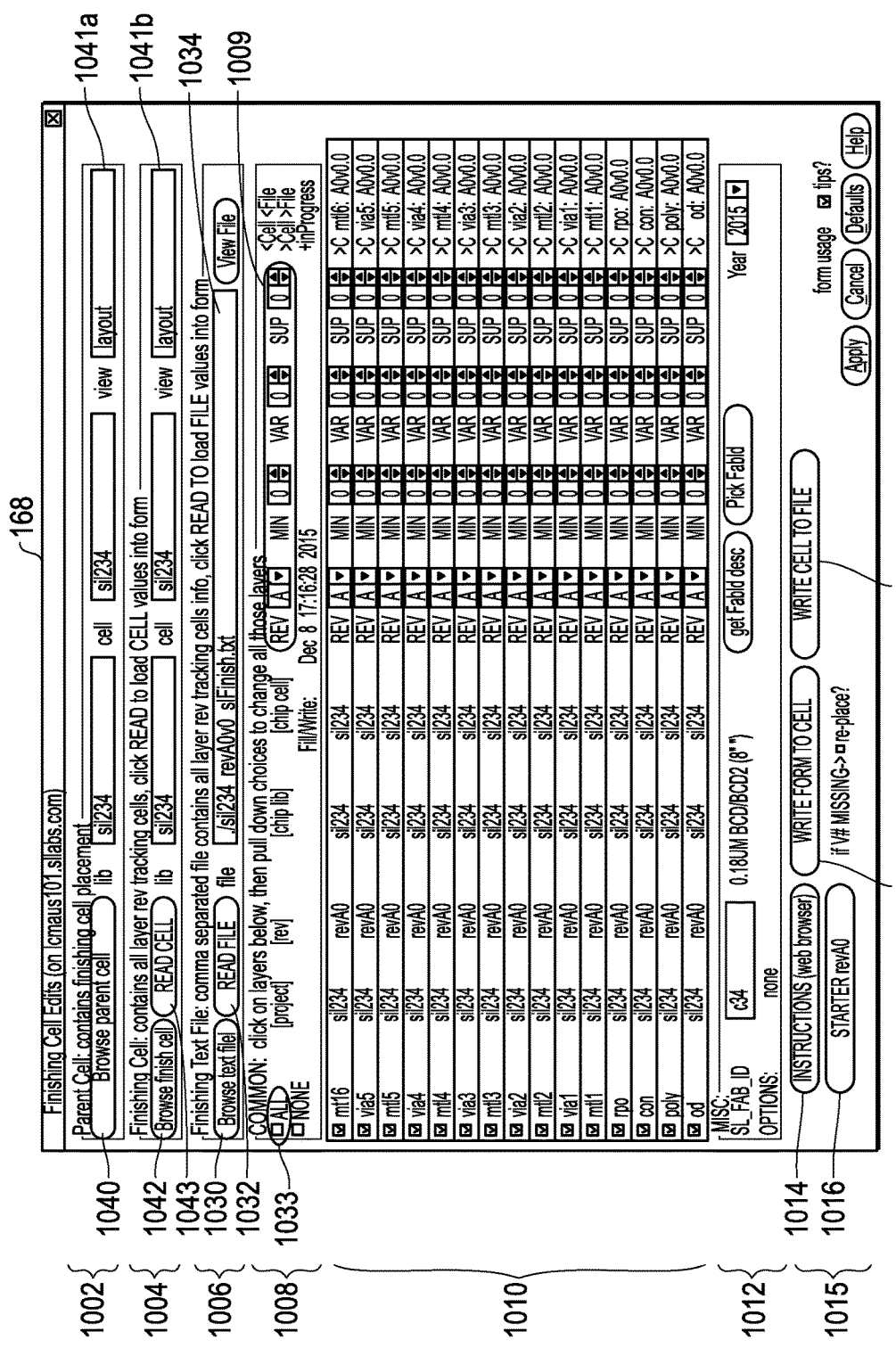
FIG. 10 illustrates a GUI according to one exemplary embodiment of the disclosed systems and methods.

FIG. 10 illustrates one exemplary embodiment of GUI 168 that may be displayed on a display device 164 to allow a user to interact and interchange information with an IC layer identification and tracking application, e.g., that is executing on processing device 158. Specifically, a user may in one embodiment employ GUI 168 to manipulate layerID PCells files 112 and/or Boolean Pcells files 114 of FIG. 1D to add an appropriate layerID PCell 112 and/or BooleanID PCell 114 to one or more of individual photomasks 102 that includes the appropriate identification information corresponding to the current revision and identity of the circuit design pattern of a given photomask 102. It will be understood that the particular layout, components and operation of GUI 168 is exemplary only, and that fewer, additional, and/or alternative combinations of components may be employed to fit the characteristics or requirements of a given layer revision identification and tracking implementation.

As shown in FIG. 10, GUI 168 may include a parent cell (i.e., a holding data cell for the finishing cell) entry row 1002 to enable a user to press a browse button 1040 to browse a data library ("lib") on storage 154 to select a current existing "chip" cell to be edited by the user and which corresponds to the parent cell name where the current finishing cell lives. A finish or finishing cell is the data cell that contains all the layerID Pcells 112, the Boolean PCells 114 and any other components the user adds for chip or layer identification (together with their relative hierarchical X-Y position to each other on different layers 102 of the chip design 100). Prior to chip fabrication, the X-Y location for the finishing cell on chip design 100 may be moved around by a user via input devices 162. A parent cell is the data cell that also contains circuitry patterns for circuit design 100.

As further described, this specified parent cell will only get edited when "STARTER CELL" 1016 or "WRITE FORM TO CELL" 1018 button is pressed because this is the action that places the selected finishing cell for the user. As shown, GUI 168 also may include a finishing cell entry row 1004 to enable a user to press browse button 1042 to browse the data library ("lib") on storage 154 to select an actual finishing cell that contains the revision (rev) letters for layers on the chip. The user may press the "WRITE FORM TO CELL" button 1018 to modify this selected finishing cell based on current form settings of GUI 168. The user may press the "STARTER CELL" button 1016 to overwrite this selected finishing cell, thus losing any edits and resetting all revs to "A" and "0". View windows 1041a and 1041b may be provided as shown in GUI 168. In the illustrated embodiment, a "Layout" view is selected or other layout view designator which could alternatively be select using "View" windows 1041a and/or 1041b, i.e., layout_1, layout_new, as opposed to schematic or symbol view.

Still referring to FIG. 10, GUI 168 may also include a finish text file entry row 1006 to enable a user to use a browse button 1032 to select or otherwise specify a finishing cell file name in the indicated window 1034. The user may press the "WRITE CELL TO FILE" button 1020 to overwrite the specified file based on current form settings. The user may press the "READ FILE" button 1030 to load a previously written finishing cell file and fill in the form to show the file's values. GUI 168 may also include a common entry row 1008 that may be provided to allow a user to change a GROUP of layers to the same revision information, as an alternative to individually setting each layer's revision identifier information using the corresponding separate pull-down fields of individual layer entry section 1010 of GUI 168. In this regard, a user may be allowed to change all selected (checkbox) layers of individual layer entry section 1010 to the specified common revision/variant/supplement revision/s selected in the common entry pulldown boxes 1009 of common entry row 1008. A user may click the "ALL" box in common entry row 1008 to select all layers on form, or may click the "NONE" box to deselect all layers on form.

GUI 168 also may include individual layer revision entry section 1010 which is the actual finishing cell that contains the revision information for layers on the chip. As before, when the "WRITE FORM TO CELL" button 1018 is pressed by a user, this cell will be modified based on current form settings. When the "STARTER CELL" button 1016 is pressed, this cell will be overwritten, losing any edits and resetting all revs to "A" and "0". Pressing the "READ CELL" button 1030 will examine the current layout finishing cell and fill in the form to show the layout's values. Also shown in FIG. 10 is miscellaneous field entry row 1012 that may be provided in GUI 168 to allow a user to enter foundry identification (FAB ID), as well as date (year) and BOOLEAN cell options (e.g., flash).

Also present in the exemplary GUI embodiment of FIG. 2 is action section 1015 that includes instruction button 1014 may be pressed by a user to a help page GUI for information. Other possible action buttons shown in this embodiment include "STARTER CELL" button 1016 that may be pressed by a user to create the initial finish cell in which ALL revision information is initialized to "A" and "0". At this time the current finish layerID PCell 112 or BooleanID PCell 114 may be automatically placed in the PARENT cell (e.g., below the x-axis) or may be manually placed later. In this regard, a user may be allowed to move the finish cell to an open space (e.g., between or outside active circuitry) on the chip (e.g., using input devices 162). Another action button of this embodiment is "WRITE FORM TO CELL" button 1018 that may be pressed by a user to modify the already existing finishing cell layout to reflect the settings currently displayed on the form of the GUI 168 for any SELECTED layers of the individual layer section 1010 (e.g., that have checkbox set to "ON"). In this regard, in one embodiment, current form settings may not be saved if the current form of GUI 168 is CANCELED without saving to layout cell or text file. A "WRITE CELL TO FILE" button 1020 may be provided as shown that may be pressed by a user to examine the current contents of the LAYOUT finish cell and save them in comma separated text in the file specified by the user, rather than saving the settings currently displayed on the form of the GUI 168. In one embodiment all revision information is so written, regardless of whether a layer is selected on the form.

Thus, in one exemplary embodiment, a basic flow that a user may employ when using the illustrated form of GUI 168 is as follows: If new chip, click "STARTER CELL" button 1016, or if revision to chip, click COMMON row 1008→"ALL" button 1033 followed by cell entry row 1004→"READ CELL" button 1043; and then 3) for any layers changing in revision, pulldown new revision information in "Individual Layer Entry" section 1010. Alternately, a user may ensure only the layers changing in revision are "selected" in individual layer entry section 1010 (checkbox="on"), and may use "COMMON" entry row 1008 revision settings to change all those layers at once. Finally, the user may click Action section 1015→"WRITE FORM TO CELL" button 1018 to modify the finish cell, followed by "WRITE CELL TO FILE" button 1020 to save in archive pattern generation (PG) directory on storage 154.

Figure 11:
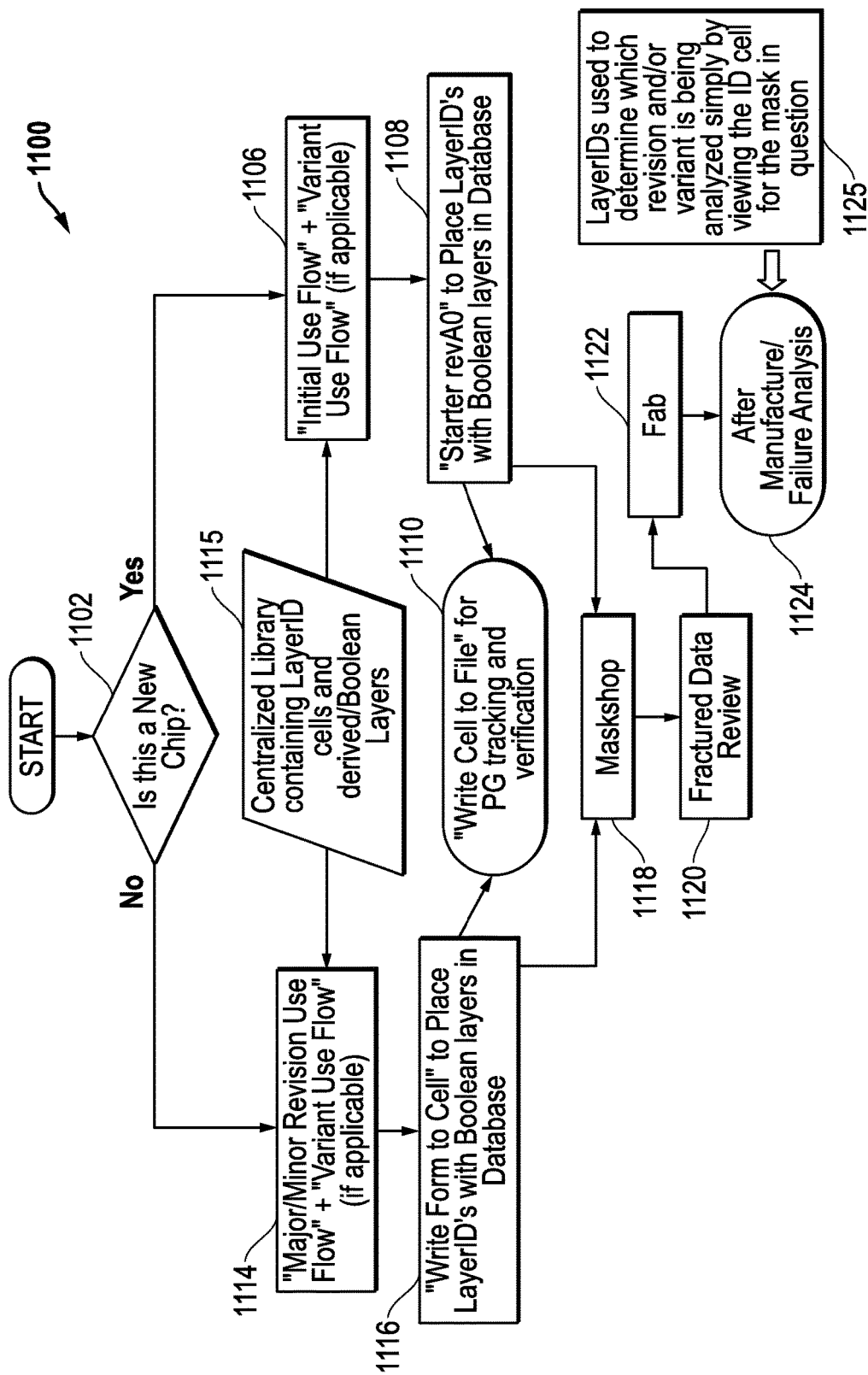
FIG. 11 illustrates methodology according to one exemplary embodiment of the disclosed systems and methods.

FIG. 11 illustrates one exemplary embodiment of a methodology 1100 that may be employed to create, identify and track revision information for individual layers of an IC design 100. In one embodiment, one or more (e.g., all) steps of methodology 1100 may be implemented in an automated manner by processing device 158 on a computing system 152 (e.g., work station) of FIG. 1D. However, it will be understood that methodology 1100 may be implemented in any other suitable manner for identifying and tracking IC layer revisions. As described below, methodology 1100 may be implemented in one exemplary using GUI 168 to allow a user to interface with a layer identification and tracking application that is executing on processing device 158 by presenting layer information (e.g., from centralized library 199) and layer identification (e.g., layerID PCell 112) options to a user while allowing the user to input layer identification and tracking information (e.g., regarding layerID PCell format and content) and/or to make input selections regarding the same. However, it will be understood that any other suitable type of user interface may be provided to implement methodology 1100, e.g., such as using a layer identification and tracking application that is executing on processing device 158 to present a user with a series of sequential questions and/or prompts for user input (e.g., on multiple sequential display screens) rather than the user input check boxes and text windows of GUI 168.

As shown, methodology 1100 starts in step 1102 where it is determined whether the current layer identification task is for a new IC design 100. If so, then methodology 1100 proceeds to "Initial Use Flow" of step 1106 where the user selects a particular library 154 ("lib") and selects an existing parent cell name ("cell") in text box of parent cell entry row 1002 of GUI 168, and then selects a library 154 ("lib") and finish cell name ("cell") in text box of finish cell entry row 1004. User may then press the "STARTER CELL" 1016 button of GUI 168. In response to this user input, layer identification and tracking application accesses centralized library 199 in step 1115 and creates a finishing cell including multiple corresponding layers/masks 102. At this time, the layer identification and tracking application also creates a corresponding layerID cell with major revision set to 'A', and "0" revision values for minor, variant, and supplement that is placed at an arbitrary X-Y position within each of the created layerID PCells 112. The user then may use input device/s 162 to manually rearrange the placement (position) of one or more of the newly created layerID PCells 112 to satisfy openings outside of circuitry that may be available in each corresponding layer 102 of IC chip design 100, i.e., so as to position each of the created layerID cells at a position outside the respective circuit pattern 110 of its corresponding layer 102. In step 1106, no revision value changes are entered by the user.

Next, "Variant Use Flow" of step 1106 is optionally performed if applicable (e.g., a user desires to create a variant revision for the current new IC chip design). If so, then the user may copy the initial finishing cell just created above to a variant finishing cell, e.g., if copied within the same library 154, then "si1234" cell may be copied to a variant cell named "si1234v1" using GUI 168 as follows. User may enter parent cell name ("cell") in text box of parent layerID PCell cell entry row 1002 of GUI 168, and may enter a finish cell name ("cell") in text box of finish cell entry row 1004 of GUI 168. If desired at this time, the user may select all layers using check box "All" 1033 of GUI 168, and may click the "READ CELL" button 1043 to see current layerID values displayed on GUI 168. During "Variant Use Flow" of step 1066, a user may use check boxes of individual layer entry section 1010 of GUI 168 to select (check) only those layers that are to change from the previous design 100 (initial or previous variant) for the current variant (e.g., "si1234v1"), and then pulldown the desired COMMON variant value in the "VAR" pulldown box of common entry row 1008 of GUI 168. Then the user may click the "WRITE FORM TO CELL" button 1018. In response to this user input, the layer identification and tracking application updates the finishing cell with the selected layerID PCell 112 modifications with any BooleanID PCells 114 into the finishing cell to the corresponding layers/masks 102. In one exemplary embodiment, the position of layerID PCell 112 in each mask 102 is not moved from the position in the initial or previous variant mask layer in the new variant mask layer 102. Similarly, position of layerID PCell 112 in a mask layer 102 should not move between minor revisions to the mask layer 102. The user may then press the "WRITE CELL TO FILE" button 1020 in step 1110 to save an ASCII (text) file documenting current layer ID settings from the finishing cell to be saved in the PG archive directory in database 165 on storage 154 for tracking, verification, and comparison.

As shown, step 1108 also proceeds to step 1118 where the saved photomask layout data file/s 195 (i.e., edited to include appropriate layerID PCells 112, BooleanID PCells 114, etc.) may be transferred to the foundry maskshop, e.g., to maskshop workstation 170 where a maskshop user may use processing device 174 to process and separate the individual chip design layers of photomasks 102, perform Boolean operations, etc. as previously described in relation to FIG. 1D to create maskshop EDA photomask layout data file/s 197 that include the layer data from data file/s 195 together with the added data for derived or Boolean data layers. Photomask layout date file/s 197 may then be viewed using fractured data review interface 182 in step 1120 as shown. Once inspected and approved, maskshop EDA photomask layout data file/s 197 may be transferred to the FAB for die manufacture in step 1122. After die manufacture, failure analysis may be performed on one or more completed IC device die 145 in step 1124. During failure analysis, layerID Cell information (e.g., layerID PCells 112 and BooleanID PCells 114) may be viewed in step 1125 to determine and/or confirm the die variant currently being analyzed.

Returning to now to step 1102 of FIG. 11, if the current layer identification task is not for a new IC design 100, then methodology 1100 proceeds to step 1114, where the user may copy a previously created revision finishing cell to a new revision finishing cell. In such a case, the entire library 199 on storage 154 may be copied in a step 1115 for the new revision and thus the new finishing cell name (e.g., "si1234") may be the same as previous revision cell name. The user may enter parent cell name ("cell") in text box of parent layerID PCell cell entry row 1002 of GUI 168, and may enter a finish cell name ("cell") in text box of finish cell entry row 1004 of GUI 168. If desired at this time, the user may select all layers using check box "All" 1032 of GUI 168, and may click the "READ CELL" button 1043 to see current layerID values displayed on GUI 168. The user may then pulldown all but the "REV" COMMON values (i.e., pulldown only "MIN", "VAR" and "SUPP" for a major revision, or pulldown only "REV", "VAR" and "SUPP" for a minor revision) and reset the selected three pulled down boxes to appropriate revision value in the common entry row 1008 of GUI 168. Then, the user may use check boxes of individual layer entry section 1010 of GUI 168 to select (check) only those layers that are to change from the previous revision of 100 (e.g., "si1234 revA0" or "si1234revA0v1") for the current new revision (e.g., "si1234revB0" or "si1234revA0v2", respectively), and then pulldown the desired COMMON revision value (e.g., "B" in this example) in the "REV" pulldown box of common entry row 1008 of GUI 168. Then the user may click the "WRITE FORM TO CELL" button 1018 to make the modifications to the selected LayerID PCells 112 in the finishing cell. In one exemplary embodiment, the position of layerID PCell 112 in each revised mask layer 102 selected for change may be moved by the user via input devices 162 from the position in the previous revision of the mask layer 102 to a new position in the new revision mask layer 102 if needed or desired to fit the major or minor revised circuit pattern of the changed mask layer 102.

Prior to moving from step 1114 to step 1116, similar "Variant Use Flow" methodology described above in relation to step 1106 may be optionally also performed in step 1114 if variation/s are desired. Then, methodology 1100 moves from step 1114 to step 1116 where a user may press the "WRITE FORM TO CELL" button 1018 to place the layerID PCells 112 with any BooleanID PCells 114 into the finishing cell. As before, the user may then press the "WRITE CELL TO FILE" button 1020 in step 1110 to save an ASCII (text) file to a PG archive database on storage 154 for tracking, verification, and comparison. Methodology 1100 may proceed from step 1116 to step 1118 where the saved photomask layout data file/s 195 may be transferred to the foundry maskshop as previously described. Steps 1120 to 1124 may then be performed in the same manner as previously described.

It will be understood that the steps of methodology 1100 are exemplary only, and that any other combination of additional fewer and/or alternative steps may be employed that are suitable to create, identify and track revision information for individual layers of an IC design 100.

It will also be understood that one or more of the tasks, functions, or methodologies described herein (e.g., including those described herein for components 157, 158, 160, 171, 174, 176, etc.) may be implemented at least in part by circuitry and/or by a computer program of instructions (e.g., computer readable code such as firmware code or software code) embodied in a non-transitory tangible computer readable medium (e.g., optical disk, magnetic disk, non-volatile memory device, etc.), in which the computer program comprising instructions are configured when executed (e.g., executed on a processing device of an information handling system such as CPU, controller, microcontroller, processor, microprocessor, FPGA, ASIC, or other suitable processing device) to perform one or more steps of the methodologies disclosed herein. In one embodiment, such processing devices may be selected from the group consisting of CPU, controller, microcontroller, processor, microprocessor, FPGA, and ASIC. A computer program of instructions may be stored in or on the non-transitory computer-readable medium accessible by an information handling system for instructing the information handling system to execute the computer program of instructions. The computer program of instructions may include an ordered listing of executable instructions for implementing logical functions in the information handling system. The executable instructions may comprise a plurality of code segments operable to instruct the information handling system to perform the methodology disclosed herein. It will also be understood that one or more steps of the present methodologies may be employed in one or more code segments of the computer program. For example, a code segment executed by the information handling system may include one or more steps of the disclosed methodologies.

While the invention may be adaptable to various modifications and alternative forms, specific embodiments have been shown by way of example and described herein.

However, it should be understood that the invention is not intended to be limited to the particular forms disclosed. Rather, the invention is to cover all modifications, equivalents, and alternatives falling within the spirit and scope of the invention as defined by the appended claims. Moreover, the different aspects of the disclosed circuitry and methods may be utilized in various combinations and/or independently. Thus the invention is not limited to only those combinations shown herein, but rather may include other combinations.

What is claimed is:

1. An integrated circuit (IC) device die, comprising:
multiple stacked layers that each comprise a respective circuit pattern;
where each given layer of at least a selected portion of the multiple stacked layers further comprises at least one visible label disposed on an upper surface of the given layer adjacent the respective circuit pattern of the given layer, the visible label being separate from the circuit pattern of the given layer and including at least one layer revision identifier selected according to a defined visual nomenclature system to identify the current revision of the respective circuit pattern that corresponds to the given one of the selected individual layers of the IC independent of the current revision of the circuit pattern of other individual layers of the IC, and where the layer revision identifier of a first one of the multiple stacked layers is different from the layer revision identifier of a second one of the multiple stacked layers.

2. The IC device die of claim 1, where the visible label further comprises at least one first revision identifier that is an identifier character; and at least one second revision identifier that is a comb identifier structure having a plurality of tabs; where the identifier character includes an alphabetic or numeric character corresponding to an identity of a first type of revision; and where the number and location of the comb structure tabs corresponds to an identity of a second type of revision.

3. A photomask system, comprising multiple photomasks of a multi-layer integrated circuit (IC) design for a device die; where each of the multiple photomasks defines a different individual layer of multiple stacked layers of the multi-layer IC; where each of the multiple photomasks comprises:
a given circuit pattern corresponding to a respective one of the individual layers of the IC, and
at least one layer revision identification parameterized data cell (layerID PCell) corresponding to the individual layer of the IC, the layer ID PCell being separate from the circuit pattern of the individual layer of the IC;
where the layerID PCell comprises at least one visible layer revision identifier corresponding to a defined visual nomenclature system that identifies a current revision of the given circuit pattern of the individual layer of the IC that is independent of the current revision of the circuit pattern of other individual layers of the IC; and
where the layer revision identifier of a layerID PCell of a first one of the multiple photomasks is different from the layer revision identifier of a layerID PCell of a second one of the multiple photomasks.

4. The photomask system of claim 3, where the layerID PCell of each of the multiple photomasks further comprises multiple separate revision identifiers.

5. The photomask system of claim 4, where the multiple separate revision identifiers include at least one major revision identifier, at least one minor revision identifier, at least one variant revision identifier and at least one supplement revision identifier.

6. The photomask system of claim 3, where the layerID PCell of each of the multiple photomasks further comprises at least one first revision identifier that is an identifier character; and at least one second revision identifier that is a comb identifier structure having a plurality of tabs; where the identifier character includes an alphabetic or numeric character corresponding to an identity of a first type of revision; and where the number and location of the comb structure tabs corresponds to an identity of a second type of revision.

7. The photomask system of claim 3, where the layerID PCell of each of the multiple photomasks further comprises at least one layer identifier that corresponds to the identity of a type of a respective different individual layer and/or a location of a respective different individual layer within the multiple stacked individual layers of the IC.

8. The photomask system of claim 3, where at least a first one of the multiple photomasks further comprises at least one Boolean operation identifier PCell (BooleanID PCell) placed to denote a Boolean operation relationship between the given circuit pattern of the first photomask and at least one other given circuit pattern of a second one of the multiple photomasks that is different from the first one of the multiple photomasks.

9. A photomask, comprising:
multiple separate circuit patterns defined on the photomask, each of the multiple separate circuit patterns corresponding to an individual layer of a different IC device die; and
multiple layer revision identification parameterized data cells (layerID PCells) defined on the photomask separate from the circuit patterns and having layer revision identifiers according to a defined nomenclature system, with at least one layerID PCell corresponding to the individual layer of each of the different IC device dies; and
where the layer revision identifier of a layerID PCell that corresponds to an individual layer of a first one of the different IC device dies is different from the layer revision identifier of a layerID PCell that corresponds to an individual layer of a second one of the different IC device dies.

10. A method of providing layer identification information for at least one individual layer of a multi-layer integrated circuit (IC) device die design, the method comprising using at least one processing device to:
receive a user selection of at least one layer revision identifier to identify a current revision of a given circuit pattern of a selected individual layer of the IC, the selected layer revision identifier being independent of the current revision of the circuit pattern of other individual layers of the IC;
respond to the user selection by creating at least one layer revision identification parameterized data cell (layerID PCell) corresponding to the selected individual layer of the IC, the layerID PCell including the selected layer revision identifier;
access a data file stored in a storage device that is coupled to the processing device to retrieve a data cell that contains multiple circuit patterns for respective multiple layers of the IC, the multiple layers of the IC including the given circuit pattern of the selected individual layer of the IC; and add the created layerID PCell to the retrieved data cell to create a layout data file corresponding to a photomask that includes a combination of the created layerID PCell and the given circuit pattern within the selected individual layer of the IC design.

11. The method of claim 10, further comprising using at least one processing device to:
receive a user selection of multiple layer revision identifiers, each of the multiple selected layer revision identifiers being selected by the user to independently identify a current revision of a respective circuit pattern of a given one of the selected individual layers of the IC that is different from all of the other selected individual layers of the IC;
respond to the user selection by creating at least one layerID PCell corresponding to each given one of the user-selected individual layers of the IC, each of the created layerID PCells including the layer revision identifier selected for the current revision of the respective circuit pattern corresponding to a given one of the selected individual layers of the IC;
access a data file stored in a storage device that is coupled to the processing device to retrieve a data cell that contains multiple circuit patterns for respective multiple layers of the IC, the multiple layers of the IC including the given circuit patterns of the selected individual layers of the IC; and
add the created layerID PCells to the retrieved data cell to create a layout data file that includes a respective combination of a created layerID PCell and a corresponding given circuit pattern within each of the selected individual layers of the IC;
where the method further comprises creating a photomask from the layout data file corresponding to each of the selected individual layers of the IC, each photomask including a combination of the created layerID PCell and the given circuit pattern within the selected individual layer of the IC.

12. The method of claim 11, further comprising using the at least one processing device to display the layout data file on a display device coupled to the at least one processing device.

13. The method of claim 11, further comprising using multiple photomasks corresponding to the individual layers of the layout data file to manufacture an IC device die having multiple stacked device layers, each of the individual layers of the die including a circuit pattern adjacent a visible label formed thereon according to a corresponding one of the layerID PCells.

14. The method of claim 13, further comprising visually exposing at least one of the visible labels on an individual given layer of the IC device die; and analyzing the exposed visible label to determine the layer revision of the individual given layer.

15. The method of claim 11, further comprising using the processing device to:
combine the multiple layerID PCells into a single finishing data cell;
combine the finishing cell with the retrieved data cell that contains multiple circuit patterns for respective multiple layers of the IC; and
respond to commands from a user to move the X-Y location of the finishing cell relative to the circuit pattern within each of the selected individual layers of the IC in the layout data file.

16. The method of claim 10, where the layerID PCell further comprises multiple separate revision identifiers.

17. The method of claim 16, where the multiple separate revision identifiers include at least one major revision identifier, at least one minor revision identifier, at least one variant revision identifier and at least one supplement revision identifier.

18. The method of claim 10, where the layerID PCell further comprises at least one first revision identifier that is an identifier character; and at least one second revision identifier that is a comb identifier structure having a plurality of tabs; where the identifier character includes an alphabetic or numeric character corresponding to an identity of a first type of revision; and where the number and location of the comb structure tabs corresponds to an identity of a second type of revision.

19. The method of claim 10, where the layerID PCell further comprises at least one layer identifier that corresponds to the identity of a type of the individual layer and/or a location of the individual layer within multiple stacked individual layers of the IC.

20. The method of claim 10, further comprising using the at least one processing device to respond to a user selection by creating Boolean operation identifier PCells (BooleanID PCells) to denote a Boolean operation relationship between the given circuit pattern of a first individual layer of the IC and at least one other given circuit pattern of a second individual layer within multiple stacked individual layers of the IC; and adding the created BooleanID PCells to the retrieved data cell to create the layout data file.

21. The IC device of claim 1, where each of the multiple stacked layers comprises a respective different circuit pattern; and where the first one of the multiple stacked layers is stacked adjacent to the second of the multiple stacked layers such that the layer revision identifier of a first one of the multiple stacked layers is different from the layer revision identifier of the adjacent second one of the multiple stacked layers.

22. The IC device of claim 1, where each of the multiple stacked layers of the multi-layer IC comprises a respective different circuit pattern; and where the first one of the multiple photomasks comprises a circuit pattern corresponding to a first one of the individual layers that is stacked adjacent to a second one of the individual layers corresponding to a circuit pattern of the second one of the photomask such that the layer revision identifier of the first one of the multiple stacked layers is different from the layer revision identifier of the adjacent second one of the multiple stacked layers.

23. The photomask system of claim 3, where the layerID PCell of each of the multiple photomasks further comprises at least one layer identifier that corresponds to a location of a respective different individual layer within the multiple stacked individual layers of the IC.

24. The IC device of claim 1, where the visual nomenclature of the visible label of each given layer is visually readable to identify the current revision of the respective circuit pattern when visually exposed on the individual given layer of the IC device die.

25. The photomask system of claim 3, where the visual nomenclature of at least one visible layer revision identifier of each of given one of the multiple photomasks is viewable and visually readable by a user to identify the current revision of the respective circuit pattern when the given photomask is viewed by the user.

26. The photomask of claim 9, where the visual nomenclature of the layer revision identifiers is viewable and visually readable by a user to identify the current revision of the individual layers of the different IC device dies when the photomask is viewed by the user.

* * * * *